United States Patent
Lee et al.

(10) Patent No.: US 9,984,757 B2
(45) Date of Patent: May 29, 2018

(54) OPERATING METHOD OF MEMORY CONTROLLER CONTROLLING NON-VOLATILE MEMORY DEVICE PERFORMING REFRESH READ OPERATION

(71) Applicant: SAMSUNG ELECTRONICS CO., LTD., Suwon-si, Gyeonggi-do (KR)

(72) Inventors: Joon-Ho Lee, Hwaseong-si (KR); Sil-Wan Chang, Yongin-si (KR); Hyun-Jin Choi, Suwon-si (KR); Dong-Hoon Ham, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/351,576

(22) Filed: Nov. 15, 2016

(65) Prior Publication Data
US 2017/0337979 A1    Nov. 23, 2017

(30) Foreign Application Priority Data
May 19, 2016    (KR) .......................... 10-2016-0061431

(51) Int. Cl.
| G11C 16/26 | (2006.01) |
| G11C 5/14 | (2006.01) |
| G11C 16/04 | (2006.01) |
| G11C 16/30 | (2006.01) |
| G11C 16/34 | (2006.01) |
| G11C 11/56 | (2006.01) |

(52) U.S. Cl.
CPC .............. *G11C 16/26* (2013.01); *G11C 5/144* (2013.01); *G11C 11/5642* (2013.01); *G11C 16/0483* (2013.01); *G11C 16/30* (2013.01); *G11C 16/3418* (2013.01)

(58) Field of Classification Search
None
See application file for complete search history.

(56) References Cited

U.S. PATENT DOCUMENTS

| 5,768,193 A | * | 6/1998 | Lee .......................... G11C 8/08 257/E27.103 |
| 7,447,096 B2 | | 11/2008 | Riekels et al. |
| 8,243,525 B1 | * | 8/2012 | Kan .................... G11C 16/3418 365/185.11 |
| 8,281,061 B2 | | 10/2012 | Radke et al. |
| 8,443,221 B2 | | 5/2013 | Kagan et al. |
| 8,938,655 B2 | | 1/2015 | Hamilton et al. |
| 8,972,652 B2 | | 3/2015 | Kim et al. |
| 2014/0146605 A1 | | 5/2014 | Yang |
| 2015/0082120 A1 | | 3/2015 | Yang et al. |
| 2015/0178154 A1 | | 6/2015 | Kim et al. |

* cited by examiner

*Primary Examiner* — James G Norman
(74) *Attorney, Agent, or Firm* — Volentine, Whitt & Francos, PLLC

(57) ABSTRACT

An operating method of a memory controller, configured to control a non-volatile memory device that performs a refresh read operation, detects a power on state or power off state of the non-volatile memory device and issues a refresh read command. The non-volatile memory device that receives the refresh read command is controlled to perform, one time, the refresh read operation including a read operation on one of a plurality of word lines with respect to each of the plurality of memory blocks.

20 Claims, 30 Drawing Sheets

OPERATING METHOD OF MEMORY CONTROLLER CONTROLLING NON-VOLATILE MEMORY DEVICE PERFORMING REFRESH READ OPERATION

CROSS-REFERENCE TO RELATED APPLICATION

This application claims the benefit of Korean Patent Application No. 10-2016-0061431, filed on May 19, 2016, in the Korean Intellectual Property Office, the disclosure of which is incorporated herein in its entirety by reference.

BACKGROUND

1. Field

The disclosure relates to a semiconductor device, and more particularly, to a method of operating a memory controller that controls a non-volatile memory device to perform a refresh read operation in order to prevent data degradation.

2. Description of the Related Art

Research into semiconductor memory devices having a 3-dimensional (3D) structure has been conducted in order to enhance the integration of semiconductor memory devices. 3D semiconductor memory devices have different structural characteristics from conventional 2D semiconductor memory devices. Research into various methods of driving 3D semiconductor memory devices has been conducted due to the structural differences between 3D and 2D semiconductor memory devices.

3D non-volatile memory devices have a data retaining characteristic even when no power is supplied thereto. However, memory cells of non-volatile memory devices may lose data retention since charges stored in the memory cell degrade over time. Accordingly, a method of preventing data degradation of non-volatile memory devices is necessary.

SUMMARY

The disclosure provides a method of operating a memory controller that prevents data degradation through a refresh read operation performed by a non-volatile memory device.

The disclosure also provides a non-volatile memory device that performs a refresh read operation.

The disclosure also provides a method of operating a data storage device that is based on a non-volatile memory device and supports a serial advanced technology attachment (SATA) interface.

According to an aspect of the disclosure, there is provided an operating method of a memory controller configured to control a non-volatile memory device having a plurality of memory blocks, each memory block including a plurality of memory cells connected to a plurality of word lines. The operating method includes detecting a power on state of the non-volatile memory device and issuing a refresh read command. Each of the plurality of memory blocks of the non-volatile memory device that receives the refresh read command is controlled to perform, one time, a refresh read operation on one of the plurality of word lines, the refresh read operation including a read operation.

According to another aspect of the disclosure, there is provided an operating method of a memory controller configured to control a non-volatile memory device including a plurality of memory blocks having a plurality of memory cells connected to a plurality of word lines. The operating method includes detecting a power off state of the non-volatile memory device and issuing a refresh read command. Each of the plurality of memory blocks of the non-volatile memory device that receives the refresh read command is controlled to perform, one time, a refresh read operation of performing a read operation on one of the plurality of word lines.

According to another aspect of the disclosure, there is provided an operating method of a memory controller configured to control a non-volatile memory device having a plurality of memory blocks, including a plurality of memory cells connected to a plurality of word lines. The operating method includes issuing a refresh read command at a refresh read interval after the non-volatile memory device is powered on. The plurality of memory blocks of the non-volatile memory device that receives the refresh read command is controlled to sequentially perform a refresh read operation during the refresh read interval. Each of the plurality of blocks is controlled to perform, one time, the refresh read operation including performing a read operation on one of the plurality of word lines.

According to another aspect of the disclosure, there is provided a non-volatile memory device including a memory cell array having a plurality of memory blocks. Each of the memory blocks includes a plurality of memory cells connected to a plurality of word lines. A control logic is configured to select one of the plurality of word lines with respect to each of the plurality of memory blocks in response to a refresh read command and perform, one time, a refresh read operation including a read operation on the selected word line. A page buffer is connected to a plurality of bit lines of the plurality of memory blocks and configured to determine and store voltage levels of the plurality of bit lines.

According to another aspect of the disclosure, there is provided an operating method of a data storage device supporting a serial advanced technology attachment (SATA) interface. The operating method includes receiving a power saving mode request signal from a host. A refresh read operation, including a read operation on one of a plurality of word lines connected to each of a plurality of memory blocks of the data storage device, is performed one time in response to the power saving mode request signal. The refresh read operation is performed by each of the plurality of memory blocks. A response signal indicating a possibility of entering a power saving mode is transmitted to a host after performing the refresh read operation.

According to another aspect of the disclosure, there is provided a nonvolatile memory device having a plurality of memory blocks. Each of the memory blocks includes a plurality of memory cells, each of the memory cells is selected by one of a plurality of first address lines and one of a plurality of second address lines. Each of the first and second address lines selects more than one of the memory cells, and the memory cells are capable of being simultaneously erased. A memory controller, in response to detecting a memory refreshing event, executes for each of the memory blocks a read operation on memory cells selected by only one particular first address line of the first address lines and all of the second address lines.

BRIEF DESCRIPTION OF THE DRAWINGS

Embodiments of the disclosure will be more clearly understood from the following detailed description taken in conjunction with the accompanying drawings in which.

DETAILED DESCRIPTION OF THE EMBODIMENTS

Figure 1:
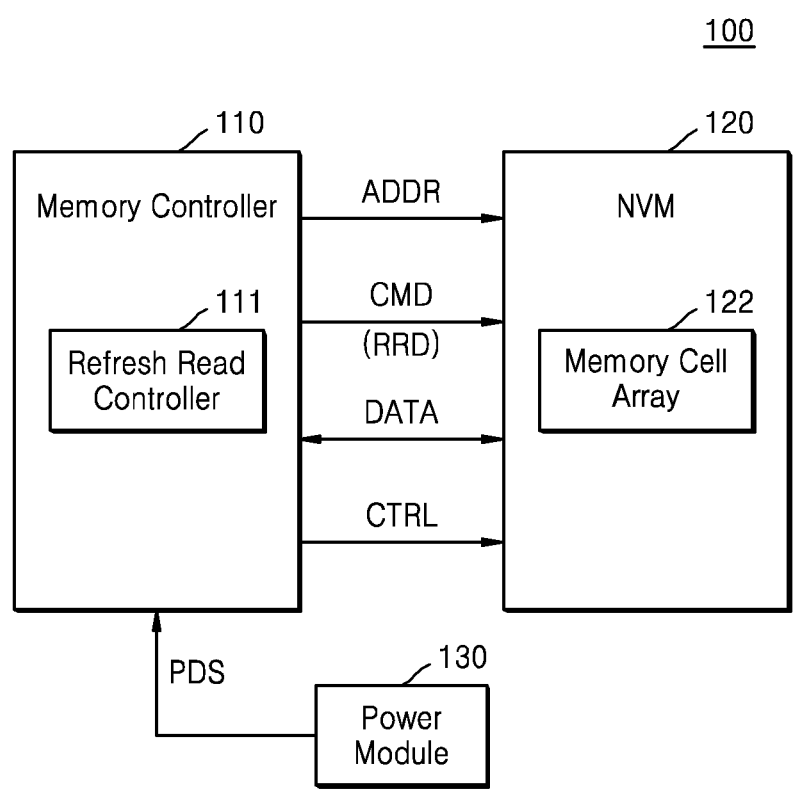
FIG. 1 is a block diagram illustrating a memory system according to an embodiment of the disclosure.

FIG. 1 is a block diagram illustrating a memory system 100 according to an embodiment of the disclosure.

Referring to FIG. 1, the memory system 100 may include a memory controller 110 and a non-volatile memory device 120. The memory system 100 may further include a power module 130 that supplies power to the memory controller 110 and the non-volatile memory device 120.

The memory controller 110 may write data DATA to the non-volatile memory device 120 or read the data DATA stored in the non-volatile memory device 120. The non-volatile memory device 120 may include non-volatile memory elements such as NAND flash memory, NOR flash memory, phase change random access memory (PRAM), resistance RAM (ReRAM), magnetic RAM (MRAM), etc. Hereinafter, the disclosure will be described on the assumption that the non-volatile memory device 120 includes NAND flash memory. For example, it is assumed that the non-volatile memory device 120 includes charge trap flash memory.

The memory controller 110 may transmit a command CMD, an address ADDR, a control signal CTRL, and the data DATA to the non-volatile memory device 120 so as to write the data DATA to the non-volatile memory device 1200. The memory controller 110 may transmit the command CMD, the address ADDR, and the control signal CTRL to the non-volatile memory device 120 so as to read the data DATA stored in the non-volatile memory device 120.

The non-volatile memory device 120 may perform data DATA write, read, and erase, etc. operations in response to signals received from the memory controller 110. The non-volatile memory device 120 may include a memory cell array 122 having memory cells which are arranged in rows (word lines) and columns (bit lines). Each of the memory cells may store 1-bit data (a single-bit) or M-bit data (multiple bits, where M is a number equal to or greater than 2). Each of the memory cells may be implemented as a memory cell having a charge storage layer such as a floating gate or a charge trapping layer, a memory cell having a variable resistor, or the like.

The memory cell array 122 may have a single-layer array structure (a two-dimensional (2D) array structure) or a multi-layer array structure (a three-dimensional (3D) array structure). A 3D memory array may be formed in a monolithic manner in an active area on a silicon substrate, at a physical level of at least one of memory cell arrays having circuits formed on the substrate or in the substrate for operations of memory cells. The term "monolithic" means that layers of each level of the 3D memory array are directly stacked on layers of a lower level of the 3D memory array.

In an embodiment according to the technical idea of the disclosure, the 3D memory array may include NAND strings disposed in a vertical direction so that at least one memory cell is located on another memory cell. The at least one memory cell may include a charge trapping layer. U.S. Pat. No. 7,679,133, U.S. Pat. No. 8,553,466, U.S. Pat. No. 8,654,587, and U.S. Pat. No. 8,559,235, and U.S. Patent Application Publication No. 2011-0233648, incorporated in their entireties in the present disclosure by reference, disclose appropriate configurations of a 3D memory array including a plurality of levels and word lines and/or bit lines shared between levels. Also, U.S. Patent Application Publication No. 2014-0334232 and U.S. Pat. No. 8,488,381 are incorporated in their entireties in the present disclosure by reference.

The memory controller 110 may include a refresh read controller 111. The refresh read controller 111 may control the memory cell array 122 of the non-volatile memory device 120 to perform a refresh read operation. The refresh read operation may prevent a charge degradation phenomenon of memory cells of the memory cell array 122 over time after the memory cells are programmed, and maintain data retention.

The refresh read controller 111 may control each of a plurality of memory blocks included in the memory cell array 122 to perform the refresh read operation including a read operation on one of a plurality of word lines of the corresponding memory block. The refresh read controller 111 may control each of the memory blocks to perform the refresh read operation one time.

The power module 130 may perform power management for supplying power to each component of the memory system 100. When a power management integrated circuit (PMIC) scheme is applied to the power module 130, a power saving function of the memory system 100 may be achieved according to a dynamic voltage and frequency scaling (DVFS) algorithm.

The power module 130 may detect a power state supplied to the memory system 100. The power module 130 may detect a change in a power supply state and transmit a power detection signal PDS to the memory controller 110. The power module 130 may transmit the power detection signal PDS when the memory system 100 is powered up or off. When the memory system 100 is powered off, the power module 130 may transmit the power detection signal PDS in response to a normal power off or a sudden power off according to a system shutdown command.

The memory controller 110 may control the refresh read controller 111 to operate in response to the power detection signal PDS. The refresh read controller 111 may control all the memory blocks of the memory cell array 122 to continuously perform the refresh read operation at one time in response to the power detection signal PDS. The refresh read controller 111 may control the memory blocks of the memory cell array 122 to sequentially perform the refresh read operation at a refresh read interval in response to the power detection signal PDS.

Figure 2:
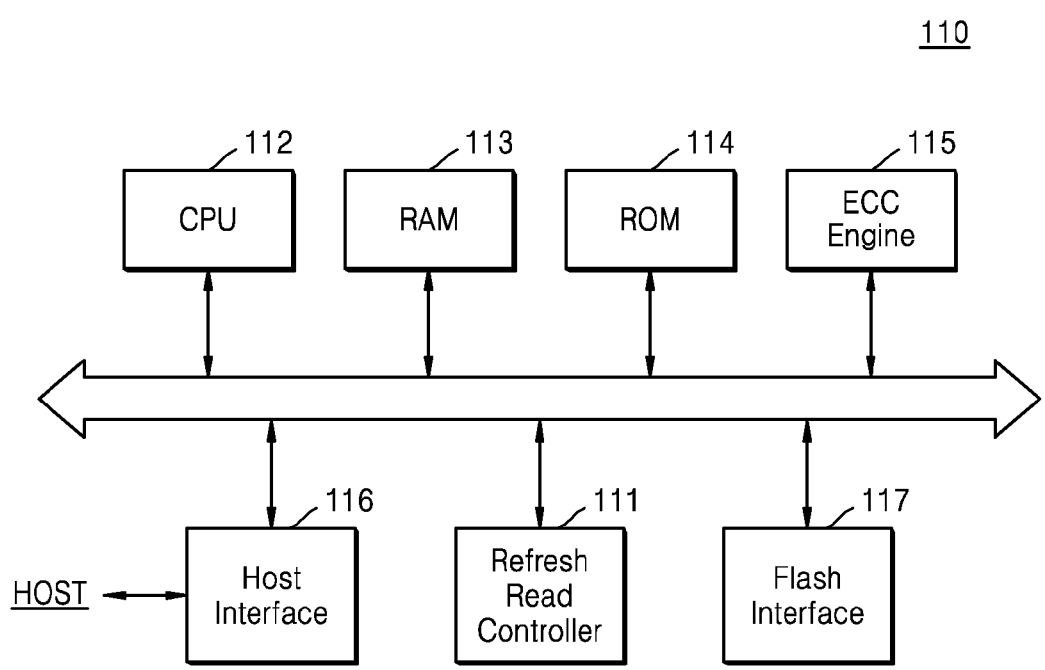
FIG. 2 is a block diagram illustrating a memory controller of FIG. 1.

FIG. 2 is a block diagram illustrating the memory controller 110 of FIG. 1.

Referring to FIG. 2, the memory controller 110 may include the refresh read controller 111, a central processing unit (CPU) 112, a RAM 113, a ROM 114, an ECC engine 115, a host interface 116, and a flash interface 117.

The refresh read controller 111 may control all memory blocks of the memory cell array 122 included in the non-volatile memory device 120 to perform an intensive refresh read operation of continuously performing a refresh read operation at one time when the memory system 100 is powered up or off as described with reference to FIG. 1 above. The refresh read controller 111 may control the memory blocks of the memory cell array 122 to perform a regular refresh read operation of sequentially performing the refresh read operation at a refresh read interval after the memory system 100 is powered up.

The CPU 112 may control general operations of the memory controller 110.

The RAM 113 may operate according to the control of the CPU 112 and may be used as a cache memory, a buffer memory, an operation memory, etc. of the memory controller 110. When the RAM 113 is used as a work memory, data processed by the CPU 112 may be temporarily stored. When the RAM 113 is used as the buffer memory, data that is to be transmitted from a host HOST to the non-volatile memory device 120 of FIG. 1 or from the non-volatile memory device 120 to the host HOST may be buffered. When the RAM 113 is used as the cache memory, the non-volatile memory device 120 may operate at high speed.

The ROM 114 may store various types of information required to operate the memory controller 110 in a firmware manner. For example, the CPU 112 may read the firmware stored in the ROM 114 and drive the read firmware.

For example, the refresh read controller 111 may be implemented as firmware, may be stored in a part of the ROM 114 or the non-volatile memory device 120, and may be driven by the CPU 112. Alternatively, the refresh read controller 111 may be implemented as a software layer, may be stored in the RAM 113, and may be driven by the CPU 112.

The ECC engine 115 may detect and correct an error of data read from the non-volatile memory device 120. For example, the ECC engine 115 may correct the error by using parity. The ECC engine 115 may correct the error of the data read by using coded modulation such as a low density parity check (LDPC) code, a BCH code, a turbo code, a convolution code, etc.

The memory controller 110 may communicate with the host HOST through the host interface 116. For example, the host interface 115 may include various interfaces such as a Universal Serial Bus (USB), a MultiMedia Card (MMC), a peripheral component interconnect express (PCI-E), an advanced technology attachment (ATA), a serial ATA (SATA), a parallel ATA (PATA), a serial attached small computer system (SAS), a small computer system interface (SCSI), an embedded MMC (eMMC), an enhanced small disk interface (ESDI), and the like.

The memory controller 110 may communicate with the non-volatile memory device 120 through the flash interface 117. For example, the flash interface 117 may be configured to support a NAND flash memory, a multi-level flash memory, and a single-level flash memory.

Figure 3:
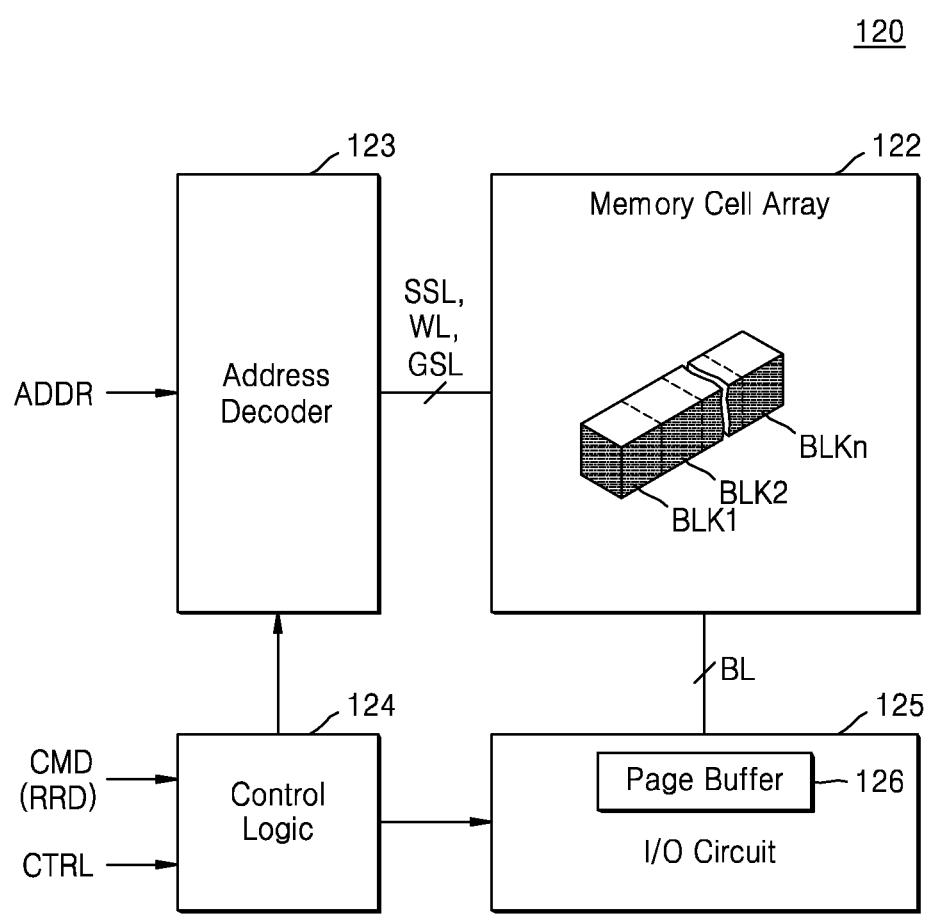
FIG. 3 is a block diagram illustrating a non-volatile memory device of FIG. 1.

FIG. 3 is a block diagram illustrating the non-volatile memory device 120 of FIG. 1.

Referring to FIG. 3, the non-volatile memory device 120 may include the memory cell array 122, an address decoder 123, a control logic 124, and an input/output (I/O) circuit 125.

The memory cell array 122 may be connected to word lines WL, string selection lines SSL, ground selection lines GSL, and bit lines BL. The memory cell array 122 may be connected to the address decoder 123 through the word lines WL, the string selection lines SSL, and the ground selection lines GSL, and to the I/O circuit 125 through the bit lines BL. The memory cell array 122 may include a plurality of memory blocks BLK1 to BLKn.

Each of the memory blocks BLK1 to BLKn may include a plurality of memory cells and a plurality of selection transistors. The memory cells may be connected to the word lines WLs. The selection transistors may be connected to the string selection lines SSLs or the ground selection lines GSLs. The memory cells of each of the memory blocks BLK1 to BLKn may be formed as single-level cells which store 1-bit data or as multi-level cells which store multi-bit data. The memory cells of each of the memory blocks BLK1 to BLKn may form a 3D structure by being stacked in a direction perpendicular to a substrate. A structure of a memory block will be described in detail with reference to FIGS. 4 and 5.

The address decoder 123 may perform selection and driving operations on the word lines WL of the memory cell array 122. The address decoder 123 may receive the address ADDR from the memory controller 110, may decode the received address ADDR, and may drive the plurality of word lines WL.

The control logic 124 may receive the command CMD and the control signal CTRL from the memory controller 110 and may control the address decoder 123 and the I/O circuit 125 in response to received signals. For example, the control logic 124 may control the address decoder 123 and the I/O circuit 125 to write the data DATA to the memory cell array 122 in response to the command CMD and the control signal CTRL. The control logic 124 may control the address decoder 123 and the I/O circuit 125 to output the data DATA stored in the memory cell array 122 in response to the command CMD and the control signal CTRL. The control logic 124 may control the address decoder 123 and the I/O circuit 125 to erase a part of the memory cell array 122 in response to the command CMD and the control signal CTRL.

The control logic 124 may control a voltage generator that generates various voltages required to operate the non-volatile memory device 120. For example, the voltage generator may generate various voltages such as a plurality of selection read voltages, a plurality of non-selection read voltages, a plurality of programming voltages, a plurality of pass voltages, and a plurality of erase voltages and provide the generated voltages to the address decoder 122.

The I/O circuit 125 may be connected to the memory cell array 122 through the plurality of bit lines BL. The I/O circuit 125 may control the plurality of bit lines BL so that the data DATA received from the memory controller 110 is written to the memory cell array 122. The I/O circuit 125 may control the plurality of bit lines BL so that the data DATA stored in the memory cell array 122 is output.

The I/O circuit 125 may include a page buffer 126. For example, the I/O circuit 125 may include components such as a column selection circuit, a write driver, a detection amplifier, a data buffer, and the like. The page buffer 126 may be connected to the bit lines BL of memory cells read from the memory blocks BLK1 to BLKn during a read operation. The page buffer 126 may compare voltage levels of the bit lines BL and a predetermined reference voltage and store a logic value according to a result of comparison in a latch to which the corresponding bit line BL is connected.

The page buffer 126 may be connected to the bit lines BL of the corresponding memory block, may compare voltage levels of the connected bit lines BL and a predetermined reference voltage and store a result of comparison in a latch during a refresh read operation of the memory blocks BLK1 to BLKn. According to an embodiment, although the page buffer 126 is connected to the bit lines BL of the corresponding memory block during the refresh read operation, the page buffer 126 may disregard or may not perform an operation of comparing the voltage levels of the connected bit lines BL and the predetermined reference voltage and storing the result of comparison. According to another embodiment, the page buffer 126 may not be connected to the bit lines BL of the corresponding memory block during the refresh read operation.

Figure 4:
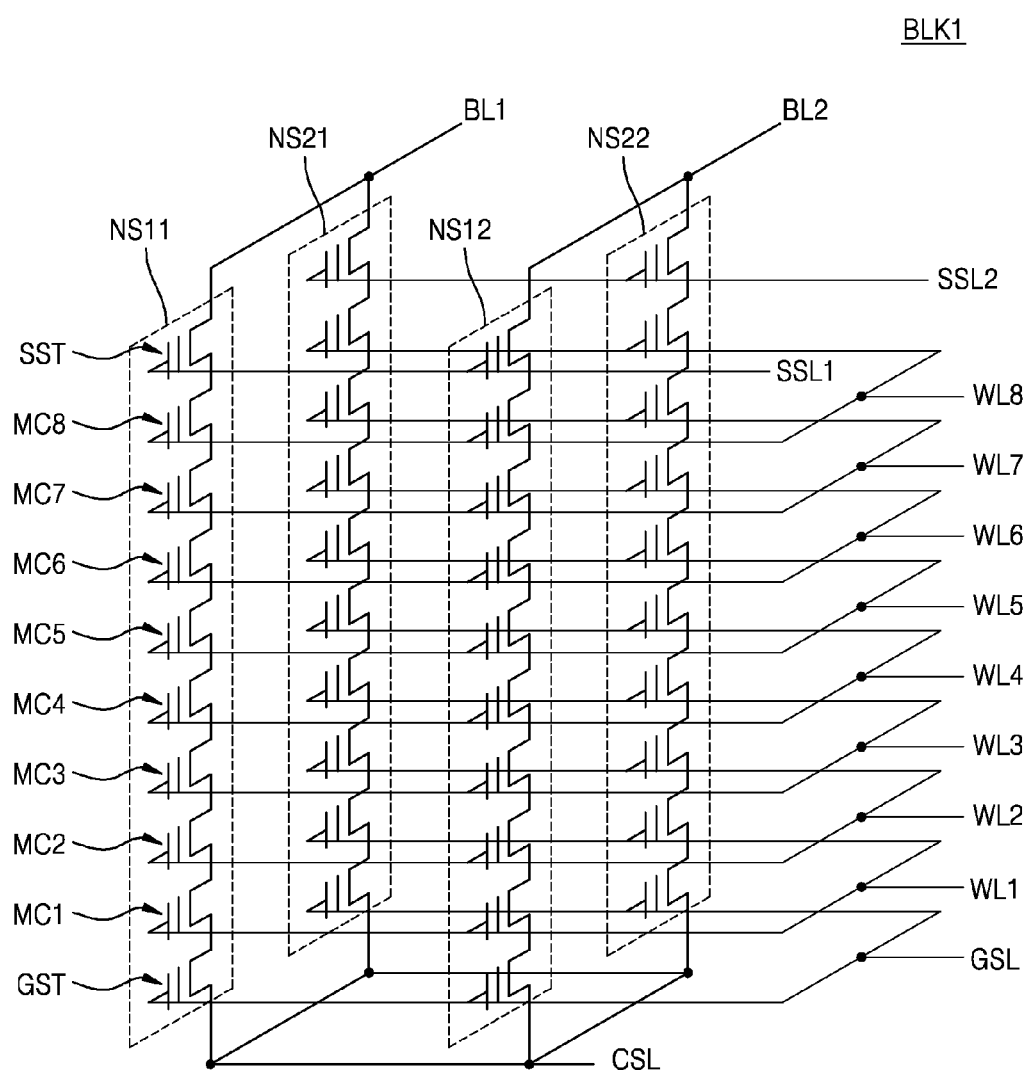
FIG. 4 is a circuit diagram illustrating an example of a memory cell array of FIG. 3.

FIG. 4 is a circuit diagram illustrating an example of the memory cell array 122 of FIG. 3. A part of the first memory block BLK1 among the memory blocks BLK1 to BLKn described with reference to FIG. 3 is described but the disclosure is not limited thereto. The other memory blocks BLK2 to BLKn may have the same structure as the first memory block BLK1.

The first memory block BLK1 may include a plurality of NAND strings NS11 to NS22, a plurality of word lines WL1 to WL8, a plurality of bit lines BL1 and BL2, a ground selection line GSL, a string selection line SSL, and a common source line CSL. The string selection line SSL may be divided into first and second string selection lines SSL1 and SSL2. In this regard, the number of the NAND strings, the number of the word lines, the number of the bit lines, the number of the ground selection lines, and the number of the string selection lines may be variously changed according to embodiments.

The first memory block BLK1 may be configured as an odd-even architecture by the divided string selection lines SSL1 and SSL2. The bit lines BL1 and BL2 may be divided into even bit lines BL1*e* and BL2*e* and odd bit lines BL1*o* and BL2*o*. In the odd-even architecture, memory cells included in a common word line and connected to the odd bit lines BL1*o* and BL2*o* may be programmed or read at a first time, whereas memory cells included in the common word line and connected to the even bit lines BL1*e* and BL2*e* may be programmed or read at a second time.

In an embodiment, the first memory block BLK1 may be configured as an all bit line (ABL) architecture by the one string selection line SSL. In the ABL architecture, all the bit lines BL1 and BL2 may simultaneously select read and programming operations. Memory cells included in the common word line and connected to all the bit lines BL1 and BL2 may be simultaneously programmed or read.

The NAND strings NS11 and NS21 may be provided between the first bit line BL1 and the common source line CSL. The NAND strings NS12 and NS22 may be provided between the second bit line BL2 and the common source line CSL. Each NAND string (e.g., NS11) may include a string selection transistor SST, a plurality of memory cells MC1 to MC8, and a ground selection transistor GST, which are connected in series.

NAND strings commonly connected to a single bit line may constitute a single column. For example, the NAND strings NS11 and NS21 commonly connected to the first bit line BL1 may correspond to a first column and the NAND strings NS12 and NS22 commonly connected to the second bit line BL2 may correspond to a second column.

NAND strings commonly connected to a single string selection line may constitute a single row. For example, the NAND strings NS11 and NS12 commonly connected to the first string selection line SSL1 may correspond to a first row and the NAND strings NS21 and NS22 commonly connected to the second string selection line SSL2 may correspond to a second row.

The string selection transistor SST may be connected to the corresponding string selection lines SSL1 and SSL2. The plurality of memory cells MC1 to MC8 may be connected to the corresponding word lines WL1 to WL8, respectively. The ground selection transistor GST may be connected to the corresponding ground selection line GSL. The string selection transistor SST may be connected to the corresponding bit lines BL1 and BL2. The ground selection transistor GST may be connected to the common source line CSL.

In the present embodiment, word lines (e.g., WL1) having the same height may be commonly connected to each other. For example, when memory cells connected to a first word line WL1 and included in the NAND strings NS11 and NS12 are programmed, the first word line WL1 and the first string selection line SSL1 may be selected.

The number of columns of the NAND strings may increase or decrease. As the number of columns of the NAND strings changes, the number of the bit lines connected to columns of the NAND strings and the number of the NAND strings connected to one string selection line may also change.

The height of the NAND strings may increase or decrease. For example, the number of memory cells stacked on each of the NAND strings may increase or decrease. As the number of memory cells stacked on each of the NAND strings changes, the number of the word lines may also change. For example, the number of string selection transistors or ground selection transistors provided to each of the NAND strings may increase. As the number of string selection transistors or ground selection transistors provided to each of the NAND strings changes, the number of string selection lines or ground selection lines may also change. If the number of string selection transistors or ground selection transistors increases, string selection transistors or ground selection transistors may be stacked in the form of the memory cells MC1 to MC8.

For example, programming and read operations may be performed in a row unit of the NAND strings NS11, NS12, NS21, and NS22. The NAND strings NS11, NS12, NS21, and NS22 may be selected in a single row unit by the string selection lines SSL1 and SSL2. The NAND strings NS11 and NS12 may be selected in a single row unit by the first string selection line SSL1. The NAND strings NS21 and NS22 may be selected in a single row unit by the second string selection line SSL2.

The programming and read operations may be performed in a page unit in selected rows of the NAND strings NS11, NS12, NS21, and NS22. A page may be a single row of memory cells connected to a single word line. The memory cells may be selected in the page unit by the word lines WL1 to WL8 in the selected rows of the NAND strings NS11, NS12, NS21, and NS22.

Figure 5:
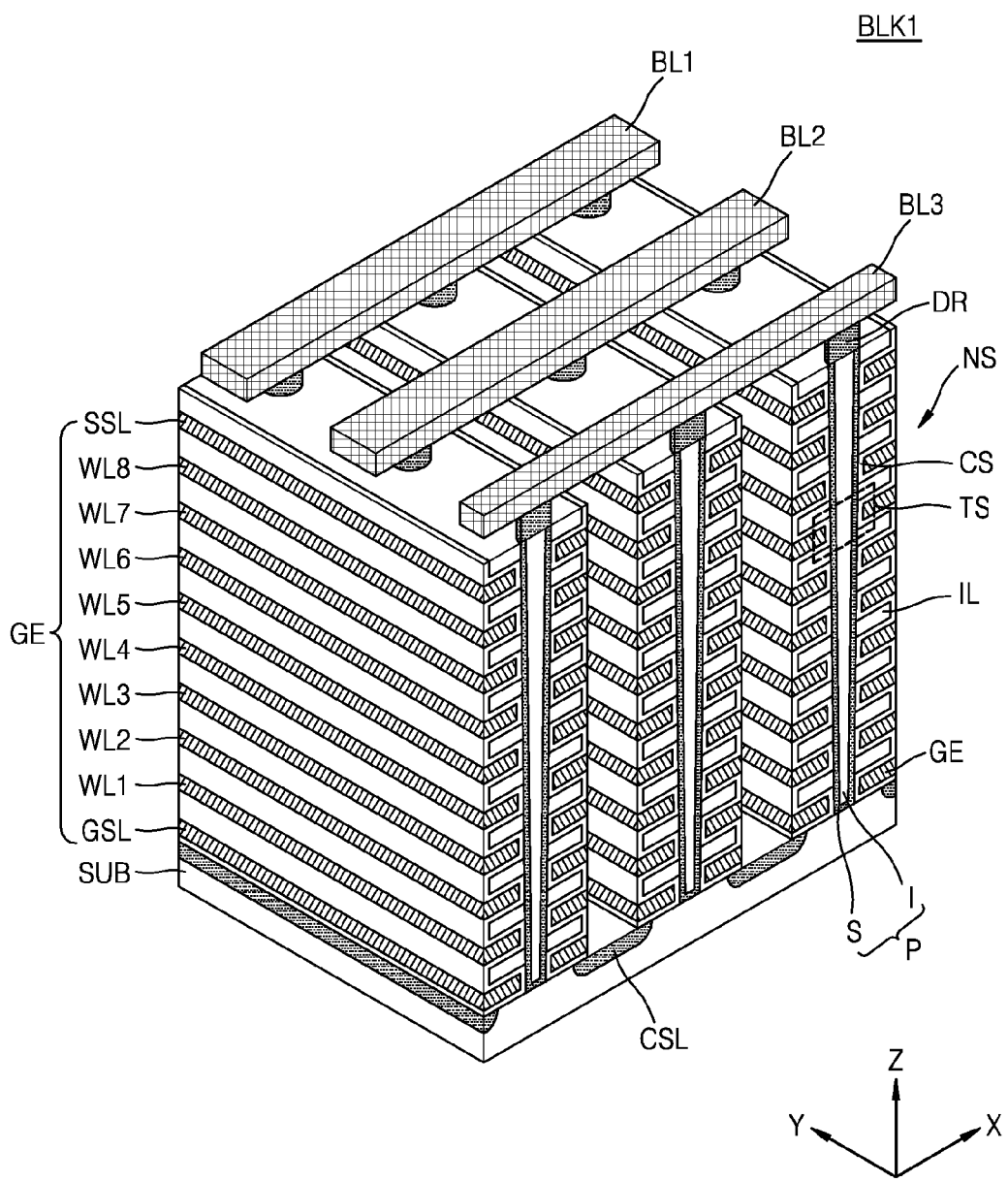
FIG. 5 is a perspective view illustrating a structure corresponding to a memory block of FIG. 4.

FIG. 5 is a perspective view illustrating a structure corresponding to the memory block BLK1 of FIG. 4.

Referring to FIG. 5, the memory block BLK1 may be formed in a direction perpendicular to a substrate SUB. In FIG. 5, although the memory block BLK1 is illustrated to include two selection lines GSL and SSL, eight word lines WL1 to WL8, and three bit lines BL1 to BL3, the memory block BLK1 may actually include more or less lines.

A common source line CSL, extending along a first direction (e.g., a Y direction) and doped with impurities having a second conductive type (e.g., an N type), may be provided on the substrate SUB that has a first conductive type (e.g., a P type). A plurality of insulating layers IL, which extend along the first direction, may be sequentially provided on an area of the substrate SUB between two adjacent common source lines CSL along a third direction (e.g., a Z direction) and may be spaced from each other by a predetermined distance along the third direction. For example, the plurality of insulating layers IL may include an insulating material such as silicon oxide.

A plurality of pillars P which are sequentially disposed along the first direction and pass through the plurality of insulating layers IL in the third direction may be provided on the area of the substrate SUB between the two adjacent common source lines CSL. For example, the plurality of pillars P may pass through the plurality of insulating layers IL to come into contact with the substrate SUB. More specifically, a surface layer S of each of the pillars P may include a silicon material having a p-type and serve as a channel area. Meanwhile, an inner layer I of each of the pillars P may include an insulating material such as silicon oxide or an air gap.

In the area between the two adjacent common source lines CSL, a charge storage layer CS may be provided along exposed surfaces of the insulating layers IL, the pillars P, and the substrate SUB. The charge storage layer CS may include a gate insulating layer (which may also be referred to as 'a tunnel insulating layer'), a charge trapping layer, and a blocking insulating layer. For example, the charge storage layer CS may have an oxide-nitride-oxide (ONO) structure. In the area between the two adjacent common source lines CSLs, gate electrodes GE such as the selection lines GSL and SSL and the word lines WL1 to WL8 may be provided on an exposed surface of the charge storage layer CS.

Drains or drain contacts DR may be respectively provided on the plurality of pillars P. For example, the drains or the drain contacts DR may include a silicon material doped with impurities having the second conductive type. The bit lines BL1 to BL3 which extend in the second direction (e.g., an X direction) and are spaced from each other by a predetermined distance along the first direction may be provided on the drain contacts DR.

Each of the pillars P may form a NAND string NS along with the insulating layer IL and the selection lines GSL and SSL and the word lines WL1 to WL8 that extend in the third direction. The NAND string NS may include a plurality of transistor structures TS. The transistor structure TS will be described in detail with reference to FIG. 6.

Figure 6:
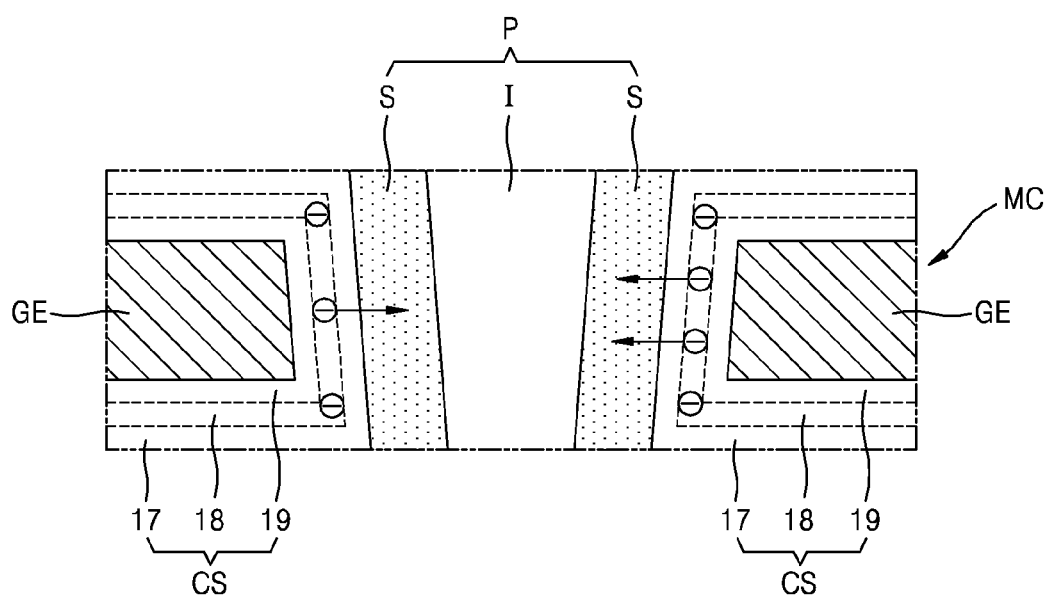
FIG. 6 is a cross-sectional view illustrating a transistor structure of FIG. 5.

FIG. 6 is a cross-sectional view illustrating the transistor structure TS of FIG. 5.

Referring to FIG. 6, the surface layer S of the pillar P may be p-type silicon and will serve as a body. The charge storage layer CS may include a tunnel insulating layer 17, a charge trapping layer 18, and a blocking insulating layer 19. The tunnel insulating layer 17 adjacent to the pillar P may include a silicon oxide layer. The charge trapping layer 18 may include a silicon nitride layer. The blocking insulating layer 19 may include a high dielectric layer having a high dielectric constant or a metal oxide layer (for example, an aluminium oxide layer and a hafnium oxide layer). The P-type silicon S of the pillar P is referred to as the body below.

An electric field may be formed between the gate GE and the body S due to a voltage difference between the gate GE and the body S. The electric field may be distributed to the tunnel insulating layer 17, the charge trapping layer 18, and the blocking insulating layer 19.

The electric field distributed to the tunnel insulating layer 17 may cause Fowler-Nordheim tunnelling. A memory cell MC may be programmed or erased by the electric field distributed to the tunnel insulating layer 17. That is, an amount of charges trapped by the charge trapping layer 18 during a programming operation or an amount of charges flowing from the charge trapping layer 18 during an erase operation may be determined by the electric field distributed to the tunnel insulating layer 17. The memory cell MC may be configured as a charge trap flash (CTF) memory cell.

Charges stored in the charge storage layer CS may be discharged over time after the CTF memory cell is programmed. As the number of times of repeating programming and erase operations increases, the tunnel insulating layer 17 degrades, and thus, a charge loss phenomenon may become worse in the CTF memory cell. Thus, a threshold voltage of the memory cell MC may change. A threshold voltage change of the memory cell MC will be described with reference to FIG. 7 below.

Figure 7:
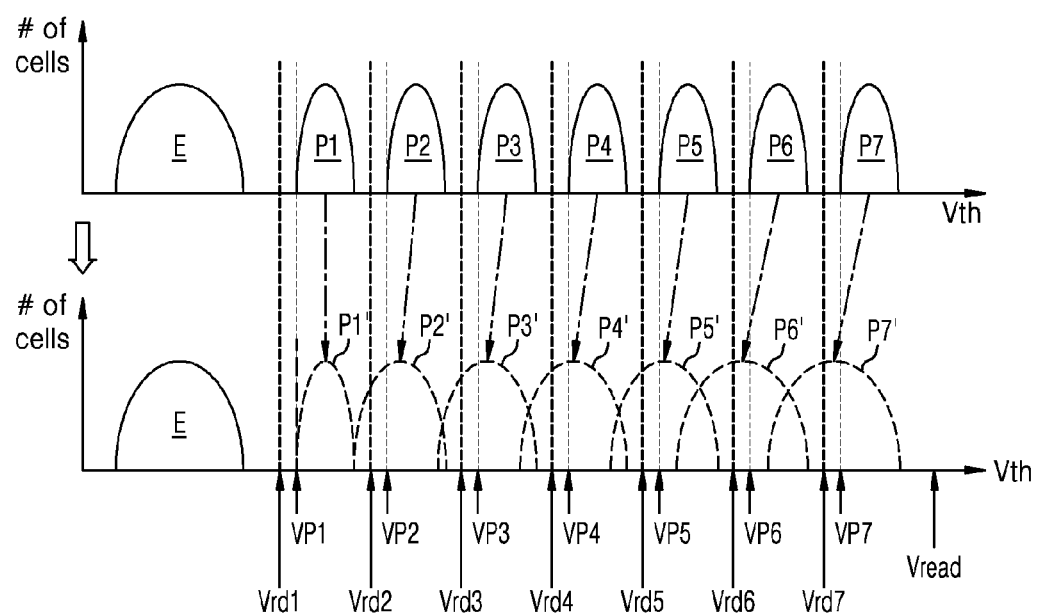
FIG. 7 is a diagram for describing a threshold voltage distribution of memory cells of FIG. 4.

FIG. 7 is a diagram for describing a threshold voltage distribution of memory cells of FIG. 4. For brevity of description, it is assumed that the memory cells are triple level cells (TLCs). The disclosure is not limited thereto. Each of the memory cells may be provided as a single-level cell (SLC) storing a single bit or a multi-level cell (MLC) storing at least two bits. Alternatively, an operation mode of each of the memory cells may be variably changed to an SLC mode or an MLC mode.

Referring to FIG. 7, the memory cells may be programmed to be in one of an erase state E and first through seventh programming states P1 through P7. For example, the memory cells may be programmed to be in one of the erase state E and the first through seventh programming states P1 through P7 based on first through seventh verification voltages VP1 through VP7.

A threshold voltage of the memory cells may change over time after the memory cells are programmed. For example, the memory cells programmed to be in the seventh programming state P7 may be a programming state P7' over time after the memory cells are programmed. That is, the memory cells programmed to be in the seventh programming state P7 may have a threshold voltage higher than the seventh verification voltage VP7. The threshold voltage of the memory cells programmed to be in the seventh programming state P7 may be less than the seventh verification voltage VP7 so that the memory cells programmed to have to be in the seventh programming state P7 may be in the programming state P7' over time after the memory cells are programmed.

Likewise, the memory cells programmed as be in first through sixth programming states P1 through P6 may respectively be in programming states P1' through P6' over time after the memory cells are programmed. This may be understood to mean that charges stored in charge storage layers of the memory cells move to a channel layer over time so that the threshold voltage of the memory cells decreases. The threshold voltage distribution of the memory cells may be referred to as a charge loss phenomenon.

When data is read based on the memory cells having the changed threshold voltage, the read data may include an error. For example, the memory cells may identify programming states thereof based on first through seventh selection read voltages Vrd1 through Vrd7. The first through seventh selection read voltages Vrd1 through Vrd7 may have voltage levels for identifying the first through seventh programming states P1 through P7. After a predetermined period of time elapses, the memory cells may have the programming states P1' through P7' according to the charge loss phenomenon. In this regard, when a read operation is performed based on the first through seventh selection read voltages Vrd1 through Vrd7, the read data may include an error.

Figure 8:
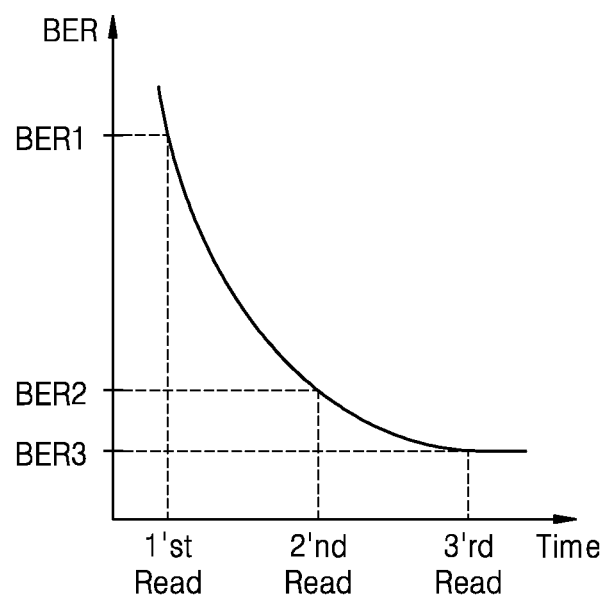
FIG. 8 is a graph illustrating a bit error rate of memory cells in a read operation.

FIG. 8 is a graph illustrating a bit error rate of memory cells in a read operation.

Referring to FIG. 8, when the non-volatile memory device 120 performs the read operation, a bit error rate BER1 included in data read during a first read operation may be high. The high bit error rate BER1 may not be corrected by using the ECC engine 115 of FIG. 2.

The first read operation may be performed after the memory cells are programmed. Thus, the bit error rate may increase as more time elapses until the first read operation is performed after the memory cells are programmed. This may be understood to mean that a probability increases that the memory cells are in the programming states P1' through P7' of FIG. 7 having a changed threshold voltage due to a charge loss phenomenon of the memory cells over time.

A bit error rate BER2 during a second read operation may be quite less than the bit error rate BER1 during the first read operation. A bit error rate BER3 during a third read operation may be less than the bit error rate BER2 during the second read operation.

The reason why the bit error rate BER2 decreases from the second read operation may be because a charge loss of the memory cells is somewhat compensated for by the first read operation. That is, voltages are applied to the memory cell array 122 of FIG. 3 during the first read operation, and thus a threshold voltage variation of the memory cells may be compensated for. For example, charges that moved to a channel layer may, but not wholly, move to a charge storage layer due to voltages applied to the selection lines CSL and SSL and the word lines WL1 through WL8 during the first read operation, and thus the threshold voltage of the memory cells may increase. Such an operation of compensating for the charge loss through a read operation is referred to as a refresh read operation.

To prevent an error from occurring due to the charge loss of the programmed memory cells of the non-volatile memory device 120, the non-volatile memory device 120 may be designed to perform the refresh read operation. However, it is difficult to perform an optimum refresh read operation since it is unknown how much time is necessary to perform the read operation after the non-volatile memory device 120 performs a programming operation.

According to embodiments of the disclosure, the memory controller 110 may control the refresh read operation of the non-volatile memory device 120 when the memory system 100 is powered on. The memory controller 110 may control the refresh read operation of the non-volatile memory device 120 when the memory system 100 is powered off. The memory controller 100 may periodically control the refresh read operation of the non-volatile memory device 120 when the memory system 100 is driven.

Figure 9:
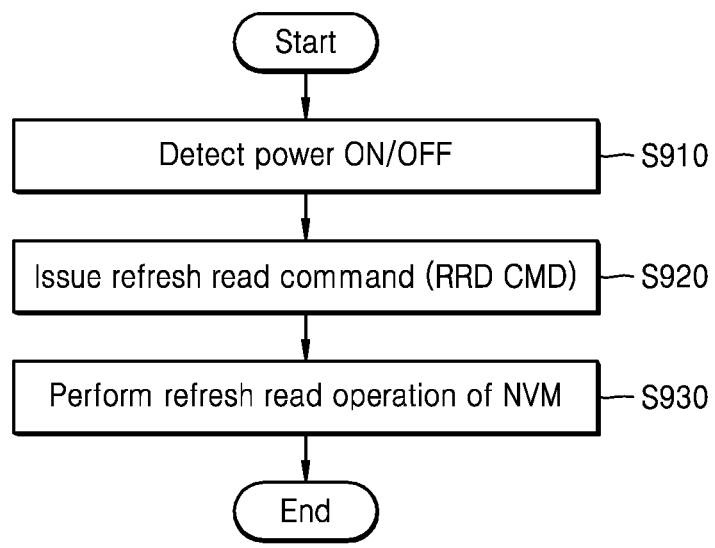
FIG. 9 is a flowchart illustrating an operation of the memory controller of FIG. 1.

FIG. 9 is a flowchart illustrating an operation of the memory controller 110 of FIG. 1.

Referring to FIGS. 1 and 9, in operation S910, the memory controller 110 may detect power on or off of the memory system 100. For example, the memory controller 110 may receive the power detection signal PDS provided from the power module 130 to detect power on or off of the memory system 100. The power off of the memory system 100 may include an expectable normal power off or an unexpectable sudden power off according to a system shutdown command.

For example, the power detection signal PDS of the power module 130 may be provided by detecting power on or off of the non-volatile memory device 120. Accordingly, the memory controller 110 may detect power on or off of the non-volatile memory device 120.

In operation S920, the memory controller 110 may issue a refresh read command RRD CMD when the memory system 100 or the non-volatile memory device 120 is powered on or off. For example, the memory controller 110 may issue the refresh read command RRD CMD in response to the power detection signal PDS of the power module 130 and provide the refresh read command RRD CMD to the non-volatile memory device 120. The refresh read command RRD CMD may instruct all the memory blocks BLK1 through BLKn of FIG. 3 included in the memory cell array 122 of the non-volatile memory device 120 to perform an intensive refresh read operation of continuously performing a refresh read operation at one time.

For example, the memory controller 110 may issue the refresh read command RRD CMD when driven after the memory system 100 is powered on. The refresh read command RRD CMD may instruct all the memory blocks BLK1 through BLKn of FIG. 3 included in the memory cell array 122 of the non-volatile memory device 120 to perform a regular refresh read operation of sequentially performing the refresh read operation at a refresh read interval.

In operation S930, the memory controller 110 may control the non-volatile memory device 120 that receives the refresh read command RRD CMD to perform the refresh read operation. For example, the non-volatile memory device 120 may perform the intensive refresh read operation or the regular refresh read operation.

All of the memory blocks BLK1 through BLKn of the memory cell array 122 may continuously perform the refresh read operation simultaneously according to the intensive refresh read operation, thereby compensating for data degradation due to a charge loss of memory cells of the memory blocks BLK1 through BLKn. All of the memory blocks BLK1 through BLKn may sequentially perform the refresh read operation during the refresh read interval according to the regular refresh read operation, thereby maintaining data retention of the memory cells of the memory blocks BLK1 through BLKn.

In this regard, the refresh read operation may be performed to prevent the data degradation of the non-volatile memory device 120 and to maintain the data retention, and thus voltage levels of the bit lines BL of the memory blocks BLK1 through BLKn used to identify read memory cell data are not important. Accordingly, the bit lines BL of the memory blocks BLK1 through BLKn may not be connected to the page buffer 126 of the I/O circuit 125 of FIG. 3.

According to an embodiment, although the bit lines BL of the memory blocks BLK1 through BLKn are connected to the page buffer 126, an operation of comparing the voltage levels of the bit lines BL and a predetermined reference voltage and storing a result of comparison may be disregarded or may not be performed by the page buffer 126.

Thereafter, a result of the refresh read operation performed by the non-volatile memory device 120 may not be provided to the memory controller 110.

FIGS. 10 through 13 are diagrams for describing a refresh read operation performed by the non-volatile memory device 120 of FIG. 9.

Figure 10:
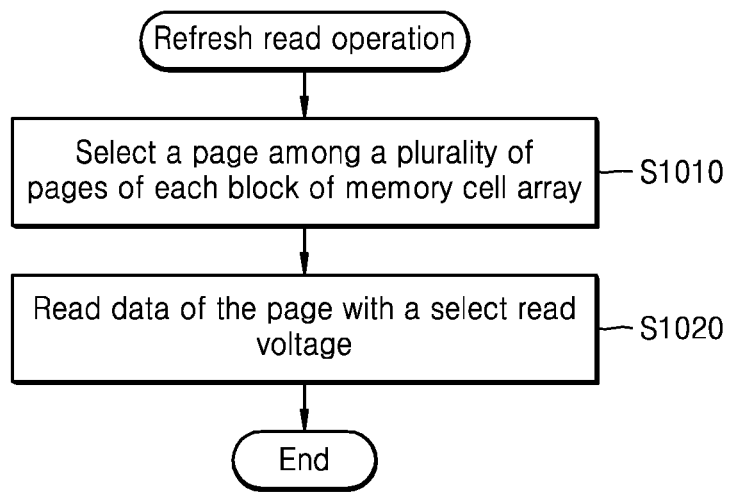
FIGS. 10 through 13 are diagrams for describing a refresh read operation performed by a non-volatile memory device of FIG. 9.

Referring to FIGS. 1, 9, and 10, the memory controller 110 may issue the refresh read command RRD CMD and provide the refresh read command RRD CMD to the non-volatile memory device 120 in operation S920. In operation S1010, the non-volatile memory device 120 may select a single page (or a single word line) from each of the memory blocks BLK1 through BLKn included in the memory cell array 122 in response to the refresh read command RRD CMD.

For example, the same or different page may be selected from each of the memory blocks BLK1 through BLKn according to the address ADDR provided by the memory controller 110. According to an embodiment, when the memory blocks BLK1 through BLKn are divided into predetermined groups, a page selected from a first group may be different from a page selected from a second group.

In operation S1020, the non-volatile memory device 120 may perform a read operation on the page selected from each of the memory blocks BLK1 through BLKn. For example, the read operation on the selected page may apply a selection read voltage to the selected page and read data of memory cells connected to the selected page.

In this regard, a general read operation may determine whether a threshold voltage distribution of a memory cell is lower or higher than a selection read voltage to read memory cell data, and thus it is important to select the selection read voltage. However, the refresh read operation applies the selection read voltage to a selected word line in order to prevent a data degradation of the memory cell and maintain data retention, and thus it is not important to select the selection read voltage. Accordingly, the selection read voltage applied to the selected word line during the refresh read operation may be set as any one of the plurality of selection read voltages Vrd1 through Vrd7 of FIG. 7.

Figure 11:
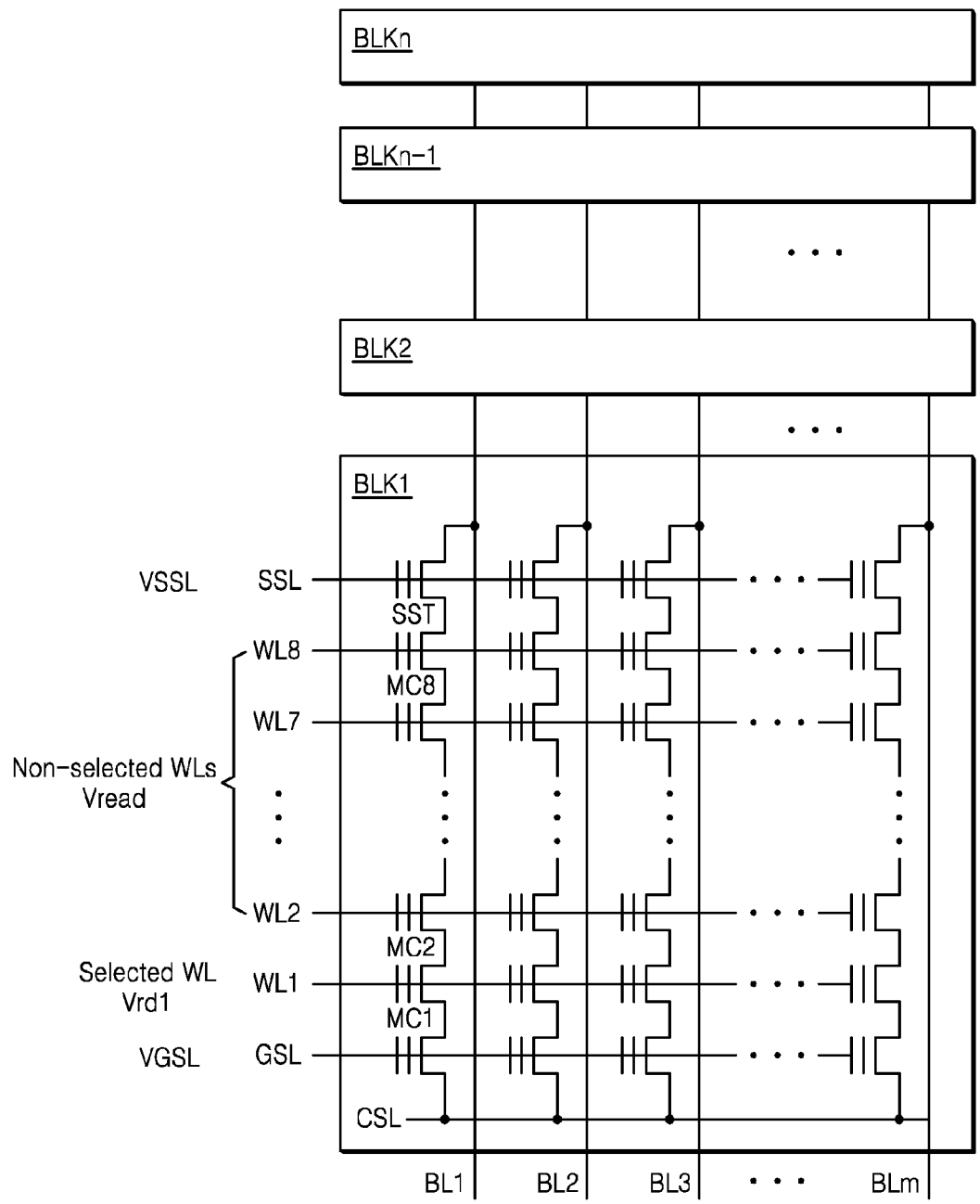

Referring to FIG. 11, an embodiment in which voltages are applied to the memory cell array 122 during the refresh read operation is illustrated. For example, the refresh read operation may be performed by the first memory block BLK1 among the memory blocks BLK1 through BLKn included in the memory cell array 122 of the non-volatile memory device 120. The refresh read operation of the first memory block BLK1 is described as a read operation performed on a single word line WL1 selected from the plurality of word lines WL1 through WL8.

A string selection voltage VSSL may be applied to the string selection line SSL and a ground selection voltage VGSL may be applied to the ground selection line GSL so that the string selection transistor SST and the ground selection transistor GST are turned on in the first memory block BLK1. For example, the string selection voltage VSSL and the ground selection voltage VGSL may be a read voltage Vread, a power voltage VDD, or a voltage having a level similar thereto.

The read voltage Vread may be applied to the non-selected word lines WL2 through WL8 and the first selection read voltage Vrd1 may be applied to the selected word line WL1 in the first memory block BLK1. The read voltage Vread may have a level higher than a distribution level of a threshold voltage Vth of memory cells as shown in FIG. 7. Accordingly, all the memory cells MC2 through MC8 to which the read voltage Vread is applied may be turned on. The first selection read voltage Vrd1 may be set to have the lowest voltage level among the voltages Vrd1 through Vrd7 for determining the first through seventh programming states P1 through P7 as shown in FIG. 7.

The bit lines BL1 through BLm may be, for example, precharged to the power voltage VDD in the first memory block BLK1.

Voltage levels of the bit lines BL1 through BLm may change according to data of memory cells connected to the selected word line WL1. For example, if there are memory cells having the threshold voltage lower than the first selection read voltage Vrd1 among the memory cells connected to the selected word line WL1, the power voltage VDD precharged to the corresponding bit line BL may be discharged to the common source line CSL, and thus a voltage of the bit line BL may be reduced. If there are memory cells having the threshold voltage higher than the first selection read voltage Vrd1 among the memory cells connected to the selected word line WL1, the corresponding bit line BL may maintain a level of the precharged power voltage VDD.

The bit lines BL1 through BLm may be connected to the page buffer 126 of the I/O circuit 125 of FIG. 3. When voltage levels of the bit lines BL1 through BLm are lower than a predetermined voltage level, the page buffer 126 may store, for example, logic low in a latch to which the corresponding bit line BL is connected. When voltage levels of the bit lines BL1 through BLm are higher than the predetermined voltage level, the page buffer 126 may store, for example, logic high, in a latch to which the corresponding bit line BL is connected.

According to an embodiment, the bit lines BL may not be connected to the page buffer 126 of the I/O circuit 125 of FIG. 3. In this case, a refresh read operation may be performed by applying only voltage levels to the string selection line SSL, the ground selection line GSL, the non-selected word lines WL2 through WL8, and the selected word line WL1.

According to an embodiment, a refresh read operation of the first memory block BLK1 may be replaced with a read operation on one of the word lines WL2 through WL8 among the plurality of word lines WL1 through WL8, instead of the first word line WL1. For example, the refresh read operation of the first memory block BLK1 may be performed based on a read operation of setting the second word line WL2 as a selection word line and the other word lines WL1 and WL3 through WL8 as non-selected word lines.

According to an embodiment, the refresh read operation of the first memory block BLK1 may select one of the selection read voltages Vrd2 through Vrd7, instead of the first selection read voltage Vrd1, and apply the selected selection read voltage to the selected word line WL1. For example, the refresh read operation of the first memory block BLK1 may be performed by applying the second selection read voltage VRd2 to the selected word line WL1.

Likewise, the memory controller 110 may perform the refresh read operation of each of the memory blocks BLK1 through BLKn, except for the first memory block BLK1, by selecting the first word line WL1 from among the plurality of word lines WL1 through WL8 included in the corresponding memory blocks BLK2 through BLKn, applying the first selection read voltage Vrd1 to the selected word line WL1, and applying the read voltage Vread to the non-selected word lines WL2 through WL8. The bit lines BL1 through BL of the corresponding memory blocks BLK2 through BLKn may be precharged to the power voltage VDD and may have voltage levels changing according to data of the memory cells connected to the selected word line WL1. Voltage levels of the bit lines BL1 through BLm of the corresponding memory blocks BLK2 through BLKn may be provided to the page buffer 126 of the I/O circuit 125 of FIG. 3. According to an embodiment, the bit lines BL1 through BLm of the corresponding memory blocks BLK2 through BLKn may not be provided to the page buffer 126 of the I/O circuit 125 of FIG. 3.

According to an embodiment, the refresh read operation of each of the memory blocks BLK2 through BLKn may be replaced with a read operation on one of the word lines WL2 through WL8 among the plurality of word lines WL1 through WL8, instead of the first word line WL1.

According to an embodiment, the refresh read operation of each of the memory blocks BLK2 through BLKn may select one of the selection read voltages Vrd2 through Vrd7, instead of the first selection read voltage Vrd1, and apply the selected selection read voltage to the selected word line WL1.

Figure 12A:
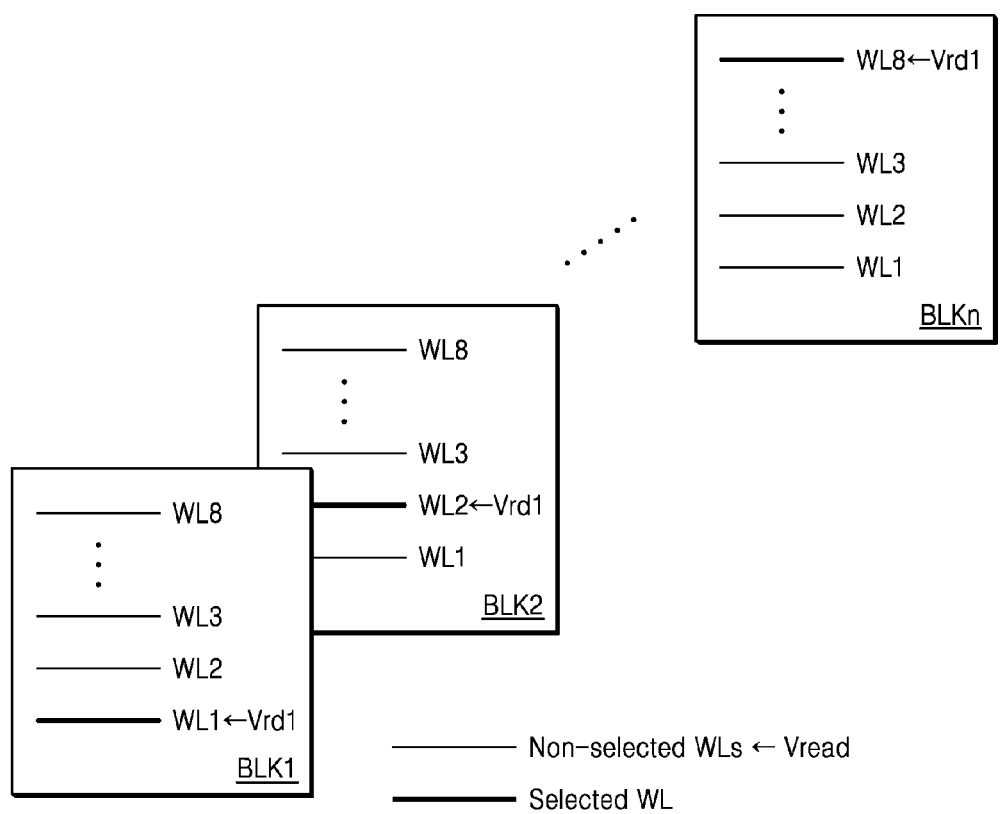

Referring to FIG. 12A, each of the memory blocks BLK1 through BLKn of the memory cell array 122 may select a different word line and perform a refresh read operation based on a read operation of the selected word line by applying the same selection read voltage Vrd1 to the selected word line of the corresponding memory blocks BLK1 through BLKn.

For example, the first memory block BLK1 may perform the refresh read operation by selecting the first word line WL1, applying the first selection read voltage Vrd1 to the selected first word line WL1, and applying the read voltage Vread to the non-selected word lines WL2 through WL8. The second memory block BLK2 may perform the refresh read operation by selecting the second word line WL2, applying the first selection read voltage Vrd1 to the selected second word line WL2, and applying the read voltage Vread to the non-selected word lines WL1 and WL3 through WL8. The nth memory block BLKn may perform the refresh read operation by selecting the eighth word line WL8, applying the first selection read voltage Vrd1 to the selected eighth word line WL8, and applying the read voltage Vread to the non-selected word lines WL1 through WL7.

According to an embodiment, the bit lines BL1 through BLm may be or may not be connected to the page buffer 126 of the I/O circuit 125 of FIG. 3 in each of the memory blocks BLK1 through BLKn that perform the read operation on different word lines.

Figure 12B:
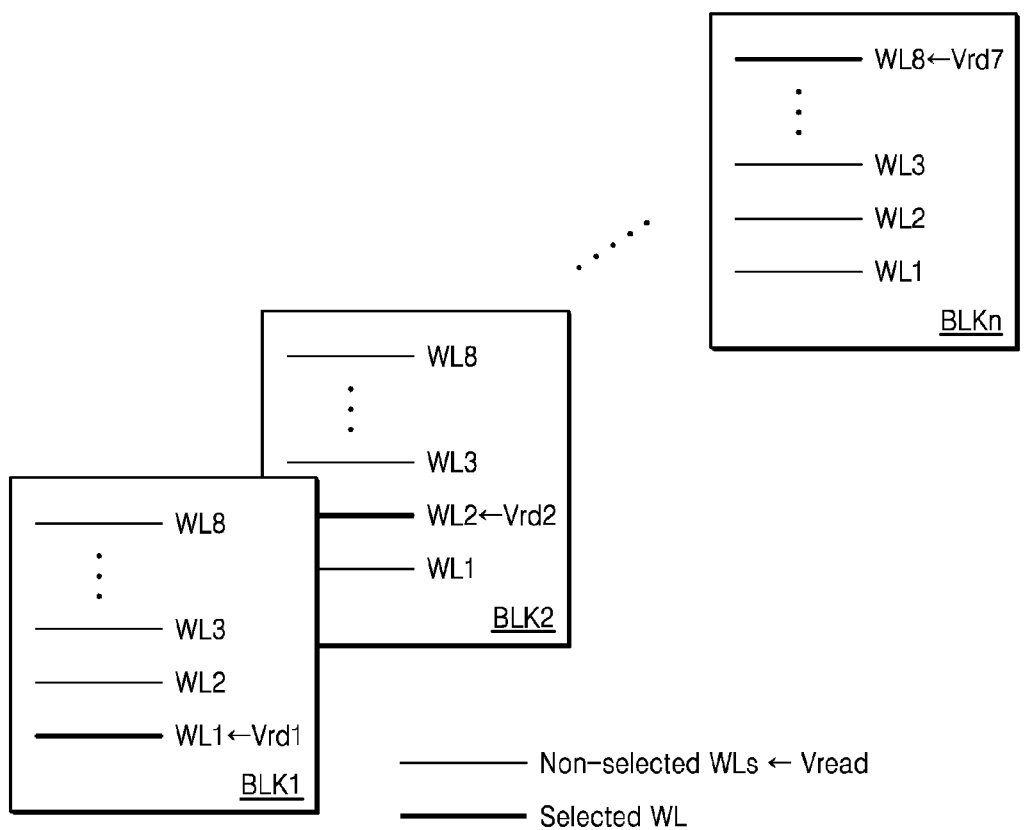

Referring to FIG. 12B, each of the memory blocks BLK1 through BLKn of the memory cell array 122 may select a different word line and perform a refresh read operation based on a read operation of the selected different word line with applying the different selection read voltages Vrd1 through Vrd7 to the selected word line of the corresponding memory blocks BLK1 through BLKn.

For example, the first memory block BLK1 may perform the refresh read operation by selecting the first word line WL1, applying the first selection read voltage Vrd1 to the selected first word line WL1, and applying the read voltage Vread to the non-selected word lines WL2 through WL8. The second memory block BLK2 may perform the refresh read operation by selecting the second word line WL2, applying the second selection read voltage Vrd2 to the selected second word line WL2, and applying the read voltage Vread to the non-selected word lines WL1 and WL3 through WL8. The nth memory block BLKn may perform the refresh read operation by selecting the eighth word line WL8, applying the seventh selection read voltage Vrd7 to the selected eighth word line WL8, and applying the read voltage Vread to the non-selected word lines WL1 through WL7.

Figure 13:
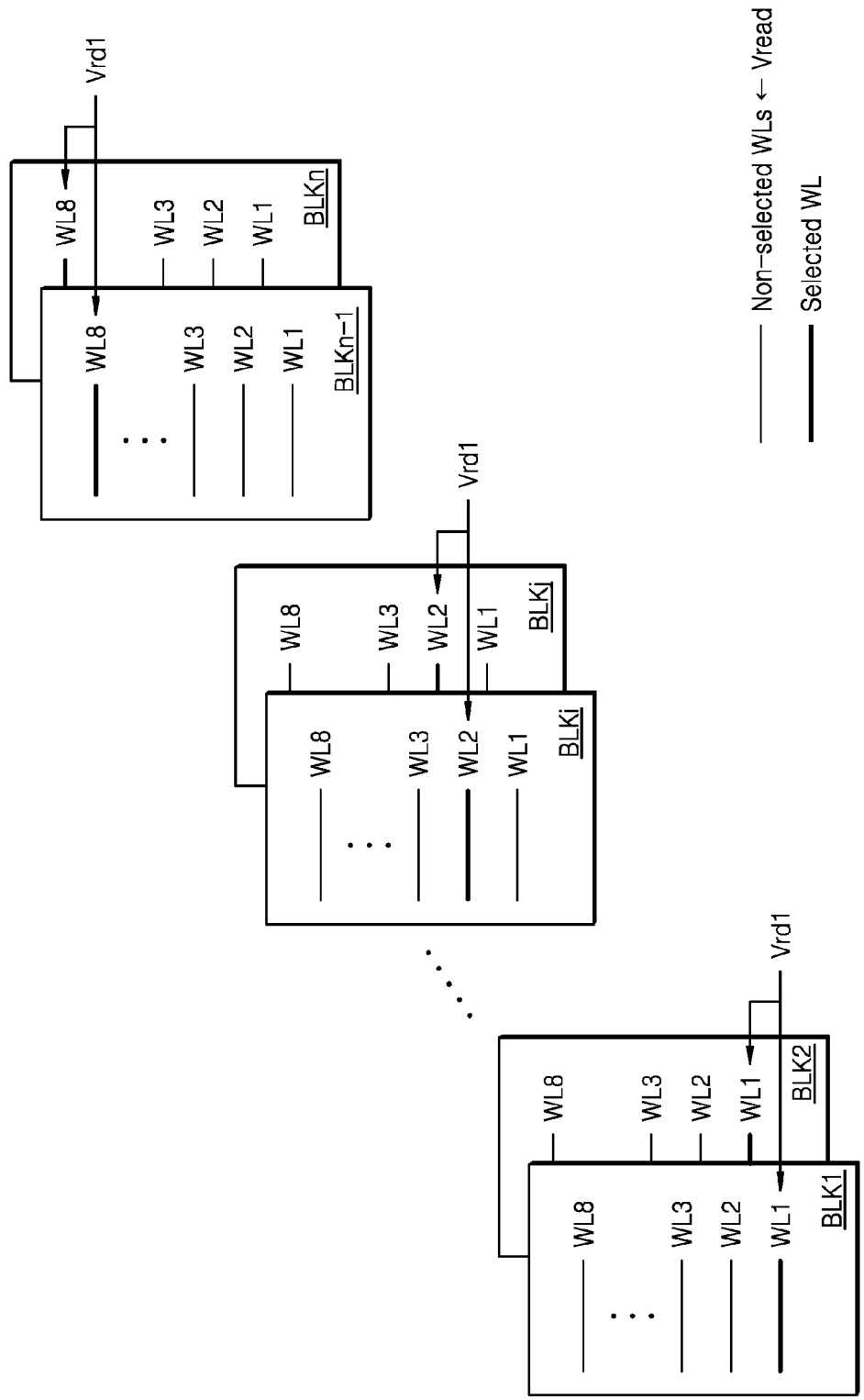

Referring to FIG. 13, the memory blocks BLK1 through BLKn of the memory cell array 122 may be divided into predetermined groups and may perform a refresh read operation based on a read operation on different word lines according to groups.

For example, the first and second memory blocks BLK1 and BLK2 may perform a refresh read operation by selecting the first word line WL1, applying the first selection read voltage Vrd1 to the selected first word line WL1, and applying the read voltage Vread to the non-selected word lines WL2 through WL8. ith and jth memory blocks BLKi and BLKj may perform the refresh read operation by selecting the second word line WL2, applying the first selection read voltage Vrd1 to the selected second word line WL2, and applying the read voltage Vread to the non-selected word lines WL1 and WL3 through WL8. n−1th and nth memory blocks BLKn−1 and BLKn may perform the refresh read operation by selecting the eighth word line WL8, applying the first selection read voltage Vrd1 to the selected eighth word line WL8, and applying the read voltage Vread to the non-selected word lines WL1 through WL7.

According to an embodiment, the bit lines BL1 through BLm may be or may not be connected to the page buffer 126 of the I/O circuit 125 of FIG. 3 in each of the memory blocks BLK1 through BLKn that perform the read operation on different word lines according to predetermined groups.

According to an embodiment, each of the memory blocks BLK1 through BLKn that performs the refresh read operation on different word lines according to predetermined groups may select one of the selection read voltages Vrd2 through Vrd7, instead of the first selection read voltage Vrd1 applied to a selected word line, and apply the selected selection read voltage to the selected word line.

Figure 14:
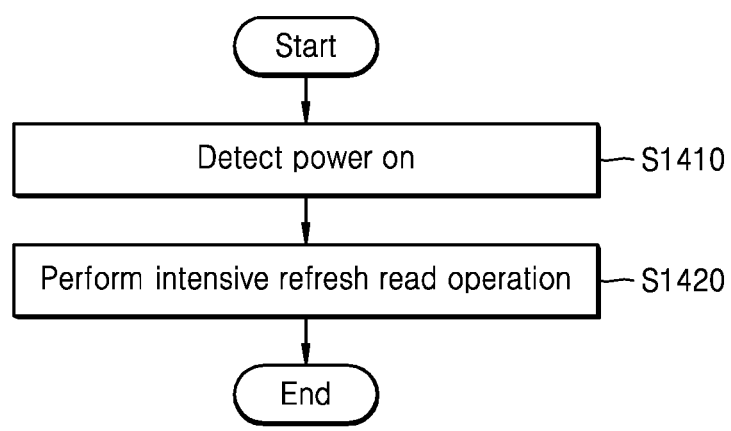
FIGS. 14 through 16 are diagrams for describing an intensive refresh read operation performed by a non-volatile memory device according to embodiments of the disclosure.
Figure 15:
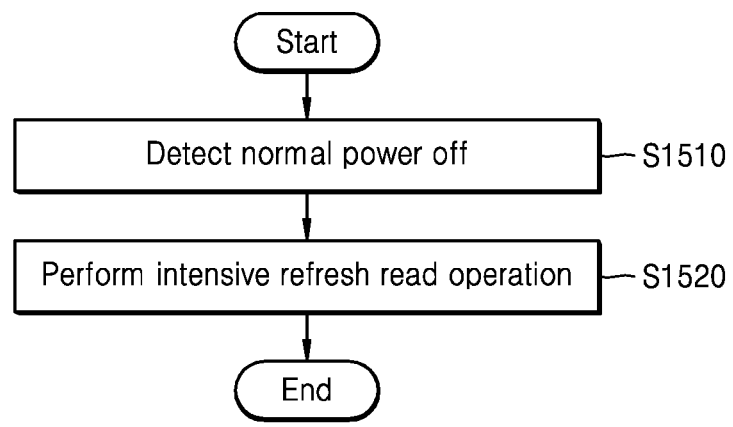
Figure 16:
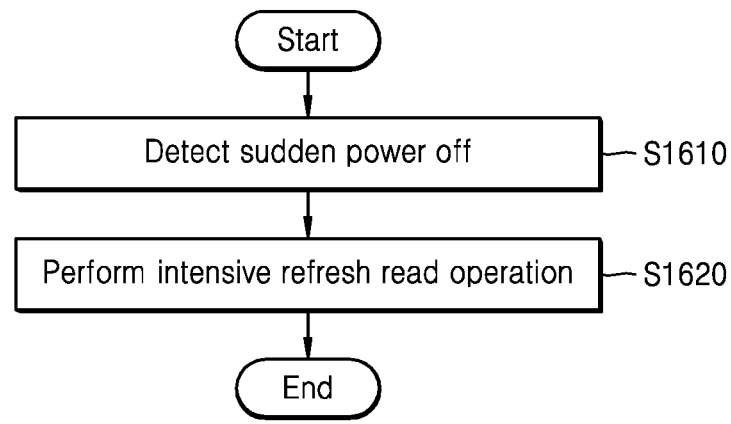

FIGS. 14 through 16 are diagrams for describing an intensive refresh read operation performed by the non-volatile memory device 120 according to embodiments of the disclosure.

Referring to FIGS. 1 and 14, the memory controller 110 may detect power on of the memory system 100 (operation S1410). For example, the memory controller 110 may receive the power detection signal PDS provided by the power module 130 and detect power on of the memory system 100.

The memory controller 110 may perform the intensive refresh read operation of the non-volatile memory device 120 when the memory system 100 is powered on (operation S1420). The intensive refresh read operation is a refresh read operation that is continuously performed by all the memory blocks BLK1 through BLKn of FIG. 3 included in the memory cell array 122 of the non-volatile memory device 120 at one time. For example, if the non-volatile memory device 120 is powered on, the refresh read operation may be continuously performed from the first memory block BLK1 to the nth memory block BLKn at one time.

According to an embodiment, the refresh read operation performed from the first memory block BLK1 to the nth memory block BLKn may be controlled such that a read operation is performed on a word line (or a page) selected from one of a plurality of word lines included in the corresponding memory block, a selection read voltage applied to the selected word line is set as one of the plurality of selection read voltages Vrd1 through Vrd7 during a read operation, and bit lines connected to memory cells connected to the selected word line are or are not connected to a page buffer.

According to an embodiment, during the intensive refresh read operation, each of the first memory block BLK1 to the nth memory block BLKn may perform the read operation by selecting the same word line or different word lines. During the intensive refresh read operation, each of the first memory block BLK1 to the nth memory block BLKn may perform the read operation by using the same selection read voltage or different selection read voltages.

Referring to FIGS. 1 through 15, the memory controller 110 may detect normal power off of the memory system 100 (operation S1510). For example, the memory controller 110 may receive the power detection signal PDS provided by the power module 130 and detect normal power off in which the memory system 100 is normally powered off. Normal power off may be performed according to a system shutdown command of the memory system 100.

The memory controller 110 may perform the intensive refresh read operation of the non-volatile memory device 120 when the memory system 100 is powered off (operation S1520). The intensive refresh read operation may be continuously performed by all the memory blocks BLK1 through BLKn of FIG. 3 included in the memory cell array 122 of the non-volatile memory device 120 at one time.

Referring to FIGS. 1 and 16, the memory controller 110 may detect sudden power off of the memory system 100 (operation S1610). For example, the memory controller 110 may receive the power detection signal PDS provided by the power module 130 and detect sudden power off in which power supply of the memory system 1000 is stopped.

The memory controller 110 may perform the intensive refresh read operation of the non-volatile memory device 120 when the memory system 100 is suddenly powered off (operation S1620). The non-volatile memory device 120 may further include an auxiliary power supply. The auxiliary power supply may be configured as a capacitor charged with power provided to the memory system 100. During sudden power off, the intensive refresh read operation may be continuously performed by all the memory blocks BLK1 through BLKn of FIG. 3 included in the memory cell array 122 at one time by using auxiliary power charged in the auxiliary power supply of the non-volatile memory device 120.

Figure 17:
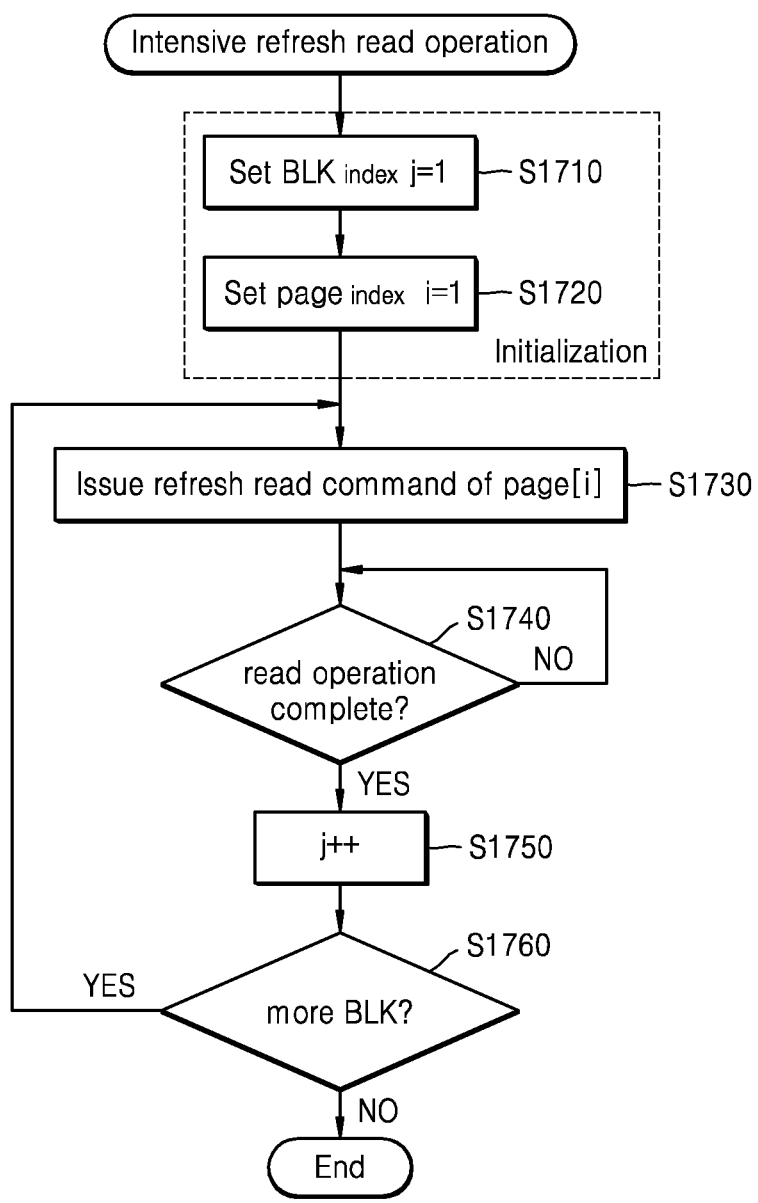
FIGS. 17 and 18 are diagrams for describing the intensive refresh read operation of FIGS. 14 through 16.
Figure 18:
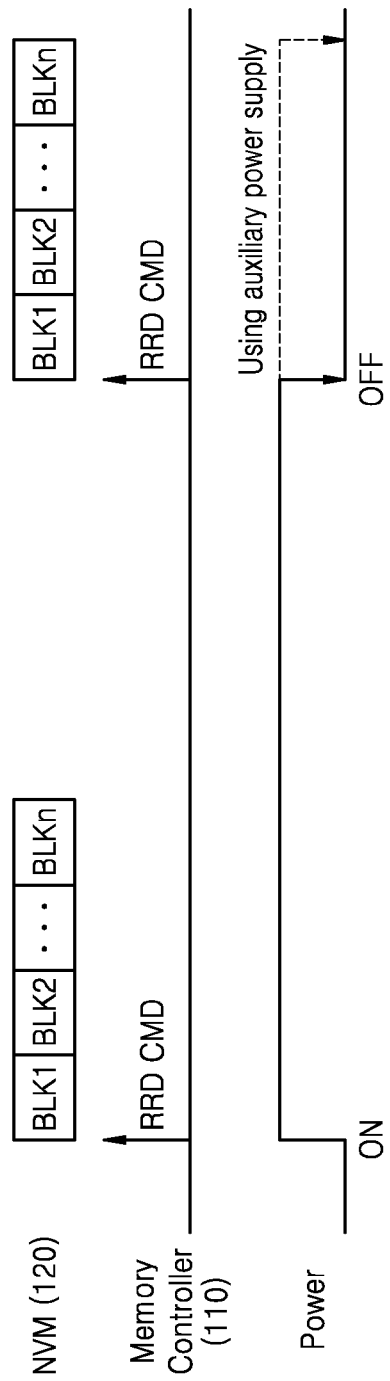

FIGS. 17 and 18 are diagrams for describing an intensive refresh read operation of FIGS. 14 through 16. FIG. 17 is a flowchart describing the intensive refresh read operation. FIG. 18 illustrates a process of performing the intensive refresh read operation of FIG. 17.

Referring to FIG. 17, the memory controller 110 of FIG. 1 may detect power on/off of the memory system 100 and then perform the intensive refresh read operation of the non-volatile memory device 120.

In operation S1710, the memory controller 110 may set a memory block index j indicating a memory block that is to perform a refresh read operation. For example, the memory controller 110 may set the memory block index j=1 when the memory system 100 is powered on or off. The memory controller 110 may perform the refresh read operation of the first memory block BLK1 as shown in FIG. 11.

According to an embodiment, the memory controller 110 may set as a memory block index j a memory block that operated right before the memory system 100 was suddenly powered off.

According to an embodiment, the memory controller 110 may set as the memory block index j a memory block that is determined to firstly require the refresh read operation among the memory blocks BLK1 through BLKn. For example, the memory controller 110 may establish a progress order of the refresh read operation according to state information of the memory blocks BLK1 through BLKn. The state information of the memory blocks BLK1 through BLKn may include an entire availability amount of the corresponding memory blocks BLK1 through BLKn, a valid data amount, a data distribution state, a wearing level, etc. The entire availability amount may mean an entire amount for storing data. The valid data amount may mean an amount of currently stored data. The data distribution state may mean a physical location of data. The wearing level may mean a wearing degree according to programming and delete (P/E) operations.

In operation S1720, the memory controller 110 may set a page index i. The memory controller 110 may select one of a plurality of pages included in a memory block corresponding to the memory block index j and set the selected page as the index i. For example, the memory controller 110 may set the page index i=1 when selecting the first word line WL1 (or a page) of the first memory block BLK1 as shown in FIG. 11. For convenience of description, it is assumed that the selected page i is the first word line WL1.

In operation S1730, the memory controller 110 may issue a refresh read command on the selected page i.

In operation S1740, the memory controller 110 may check if a read operation according to the refresh read operation with respect to the page i is completed. For example, the non-volatile memory device 120 may perform a read operation by applying the first selection read voltage Vrd1 to the first word line WL1 and applying the read voltage Vread to the non-selected word lines WL2 through WL8 as shown in FIG. 11

For example, during a read operation of the first word line WL1 of the first memory block BLK1, data of memory cells connected to the first word line WL1 may be provided to the page buffer 126 of the I/O circuit 126 of FIG. 3 through the bit lines BL1 through BLm. Alternatively, the data of memory cells connected to the first word line WL1 may not be provided to the page buffer 126.

In operation S1750, the memory controller 110 may increase the memory block index j by +1.

In operation S1760, the memory controller 110 may check if there is any other memory block on which to perform the refresh read command. For example, if the second memory block BLK2 corresponds to a memory block index j+1, the memory controller 110 may go back to operation S1730 to repeat the read operation on the page i of the second block memory BLK2. If the memory block index j+1 corresponds to a number greater than n, since the refresh read operation of all the first through nth memory blocks BLK1 through BLKn is performed, the memory controller 110 may end the intensive refresh read operation.

According to an embodiment, if the memory block that operated right before the memory system 100 was suddenly powered off is set as the memory block index j in operation S1710, in operations S1750 and S1760, all the first through nth memory blocks BLK1 through BLKn may perform the refresh read operation by repeating the read operation from a next memory block of the memory block that operated right before the memory system 100 was suddenly powered off to a final memory block.

Referring to FIG. 18, when the memory system 100 or the non-volatile memory device 120 is powered on, the memory controller 110 may provide the refresh read command RRD CMD to the non-volatile memory device 120 and the non-volatile memory device 120 may continuously perform the refresh read operation from the first memory block BLK1 to the nth memory block BLKn in response to the refresh read command RRD CMD. When the memory system 100 or the non-volatile memory device 120 is powered off, the memory controller 110 may provide the refresh read command RRD CMD to the non-volatile memory device 120 and the non-volatile memory device 120 may continuously perform the refresh read operation from the first memory block BLK1 to the nth memory block BLKn in response to the refresh read command RRD CMD.

Figure 19:
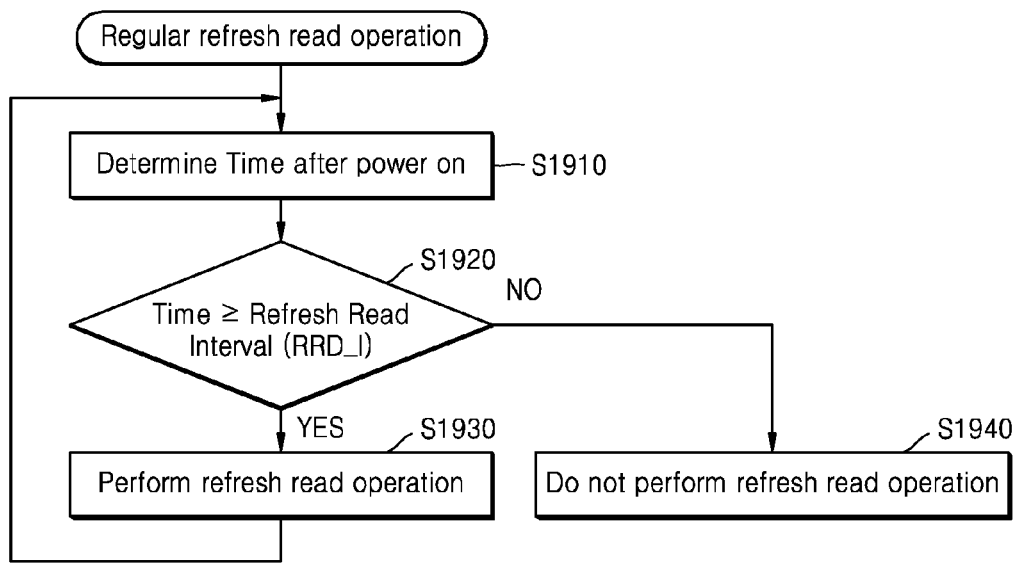
FIGS. 19 through 22 are diagrams for describing a regular refresh read operation performed by a non-volatile memory device according to embodiments of the disclosure.
Figure 20:
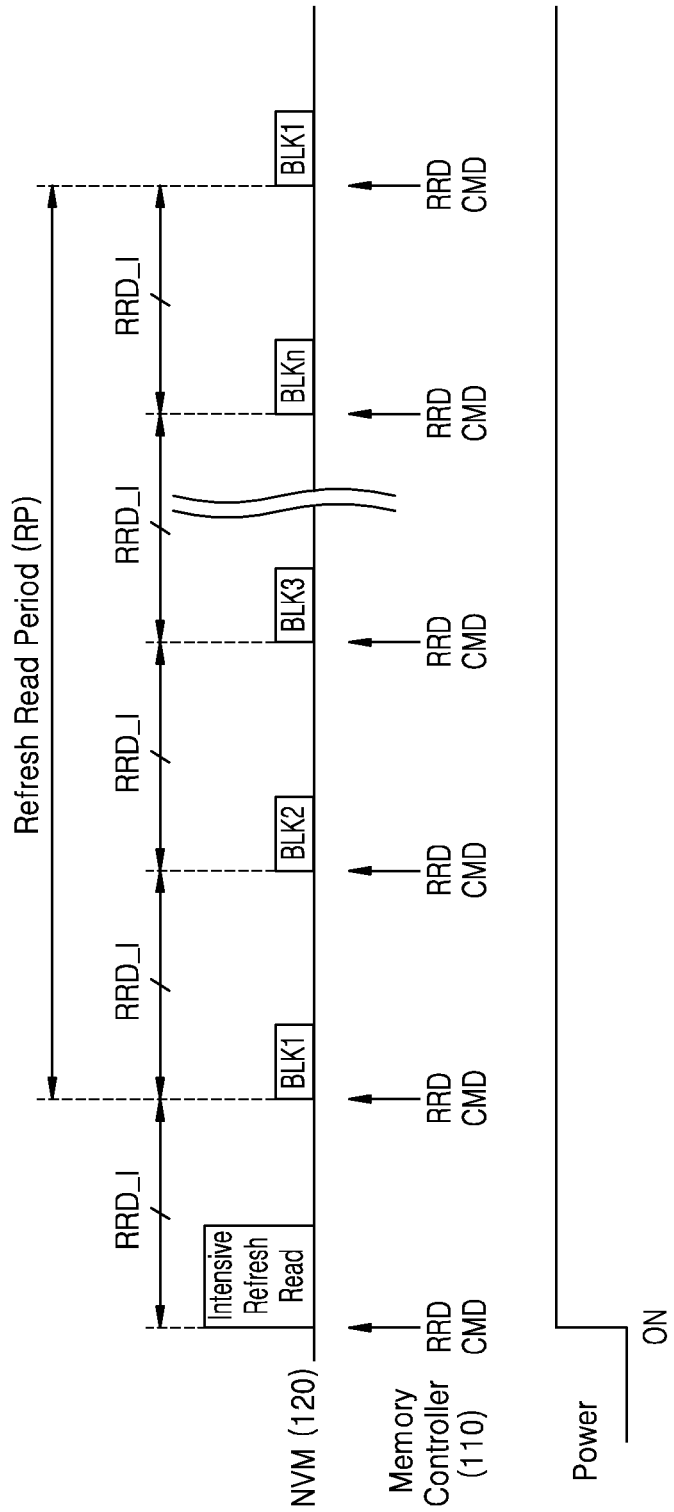
Figure 21:
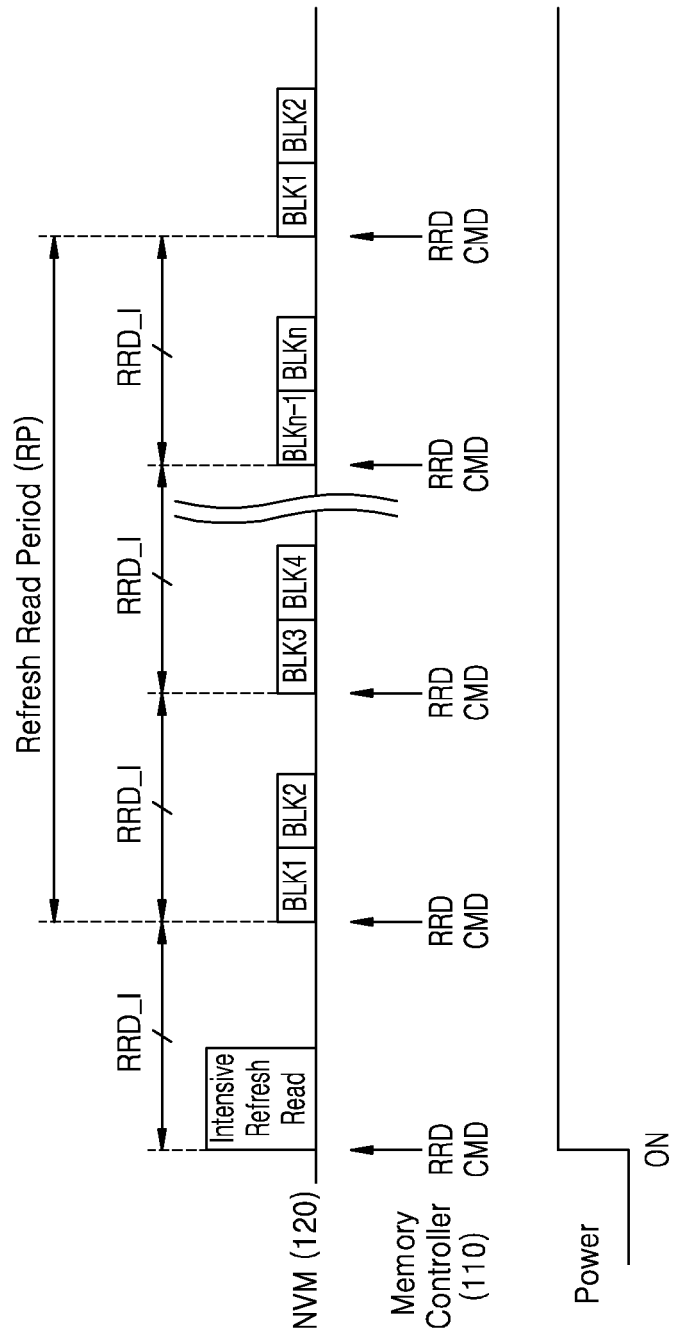
Figure 22:
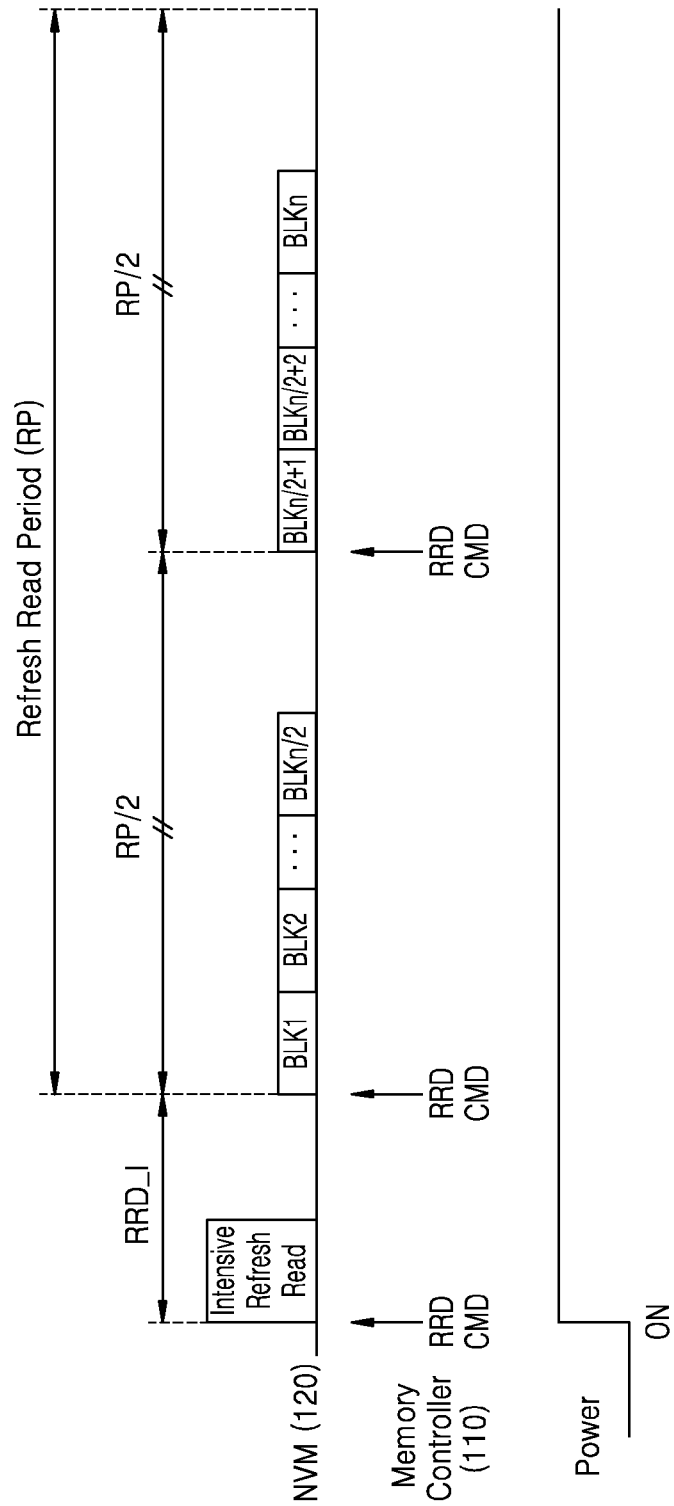

FIGS. 19 through 22 are diagrams for describing a regular refresh read operation performed by the non-volatile memory device 120 according to embodiments of the disclosure. FIG. 19 is a flowchart describing the regular refresh read operation. FIGS. 20 through 22 illustrate a process of performing the regular refresh read operation of FIG. 19.

Referring to FIGS. 1, 9, 14, and 19, the memory controller 110 may detect power on of the memory system 100 or the non-volatile memory device 120 (operations S910 and S1410) and perform an intensive refresh read operation (operation S1420) of the non-volatile memory device 120. Thereafter, in operation S1910, the memory controller 110 may determine an elapsed time Time after the memory system 100 or the non-volatile memory device 120 is powered on.

In operation S1920, the memory controller 110 may determine if the elapsed time Time is more than a refresh read interval RRD_I. As a result of the determination, if the elapsed time Time is more than the refresh read interval RRD_I, the memory controller 110 may perform the refresh read operation of the non-volatile memory device 120 (operation S1930). As a result of the determination, if the elapsed time Time is not more than the refresh read interval RRD_I, the memory controller 110 may not perform the refresh read operation of the non-volatile memory device 120 (operation S1940).

For example, the memory controller 110 may change the refresh read interval RRD_I according to temperature information of the memory system 100. For example, the memory controller 110 may set the refresh read interval RRD_I at a reference temperature. When the temperature information of the memory system 100 is higher than the reference temperature, the memory controller 110 may set the refresh read interval RRD_I as being short. When the temperature information of the memory system 100 is lower than the reference temperature, the memory controller 110 may set the refresh read interval RRD_I as being long.

The temperature information of the memory system 100 may be provided by a temperature sensor embedded in the memory system 100. For example, the temperature sensor may be embedded in the memory controller 110 or the non-volatile memory device 120. A host of an electronic device including the memory system 100 may provide the temperature information to the memory controller 110.

For example, the memory controller 110 may change the refresh read interval RRD_I according to state information of the memory blocks BLK1 through BLKn of the non-volatile memory device 120. The state information of the memory blocks BLK1 through BLKn may include an entire availability amount of the corresponding memory blocks BLK1 through BLKn, a valid data amount, a data distribution state, a wearing level, etc.

In operation S1930, the refresh read operation of the non-volatile memory device 120 may be performed by selecting a single page (or a word line) included in the corresponding memory blocks BLK1 through BLKn in response to a refresh read command issued by the memory controller 110 and performing a read operation on the selected page from the memory blocks BLK1 through BLKn as described with reference to FIG. 10.

Referring to FIG. 20, after the memory system 100 or the non-volatile memory device 120 is powered on, the memory controller 110 may issue the refresh read command RRD CMD and the non-volatile memory device 120 may perform the intensive refresh read operation.

After the memory system 100 or the non-volatile memory device 120 is powered on, the memory controller 110 may issue the refresh read command RRD CMD at the refresh read interval RRD_I and the non-volatile memory device 120 may perform the refresh read operation with respect to the corresponding memory blocks BLK1 through BLKn of FIG. 3 in response to the refresh read command CMD.

The non-volatile memory device 120 may sequentially perform the refresh read operation from the first memory block BLK1 to the nth memory block BLKn according to the refresh read command RRD CMD provided during the refresh read interval RRD_I. That is, the first through nth memory block BLK1 through BLKn may sequentially perform the refresh read operation during the refresh read interval RRD_I. Accordingly, each of the memory blocks BLK1 through BLKn may perform the refresh read operation at a refresh read period RP.

Referring to FIG. 21, the non-volatile memory device 120 may group the memory blocks BLK1 through BLKn and perform the regular refresh read operation with respect to the grouped memory blocks BLK1 through BLKn. After the memory system 100 or the non-volatile memory device 120 is powered on, the memory controller 110 may issue the refresh read command RRD CMD to control the intensive refresh read operation of the non-volatile memory device 120.

After the memory system 100 or the non-volatile memory device 120 is powered on, the memory controller 110 may issue the refresh read command RRD CMD at the refresh read interval RRD_I and the non-volatile memory device 120 may perform the refresh read operation with respect to memory block groups BLK1-BLK2, BLK3-BLK4, ... in response to the refresh read command CMD.

Referring to FIG. 22, the memory controller 110 may perform a burst refresh read operation of the memory blocks BLK1 through BLKn of the non-volatile memory device 120. After the memory system 100 or the non-volatile memory device 120 is powered on, the memory controller 110 may issue the refresh read command RRD CMD to control the intensive refresh read operation of the non-volatile memory device 120.

After the memory system 100 or the non-volatile memory device 120 is powered on, the memory controller 110 may issue the refresh read command RRD CMD at the refresh read interval RRD_I and the non-volatile memory device 120 may continuously perform the refresh read operation of a first half of the memory blocks BLK1 through BLKn and, after a half RP/2 of the refresh read period RP, of a second half thereof in response to the refresh read command CMD.

Figure 23:
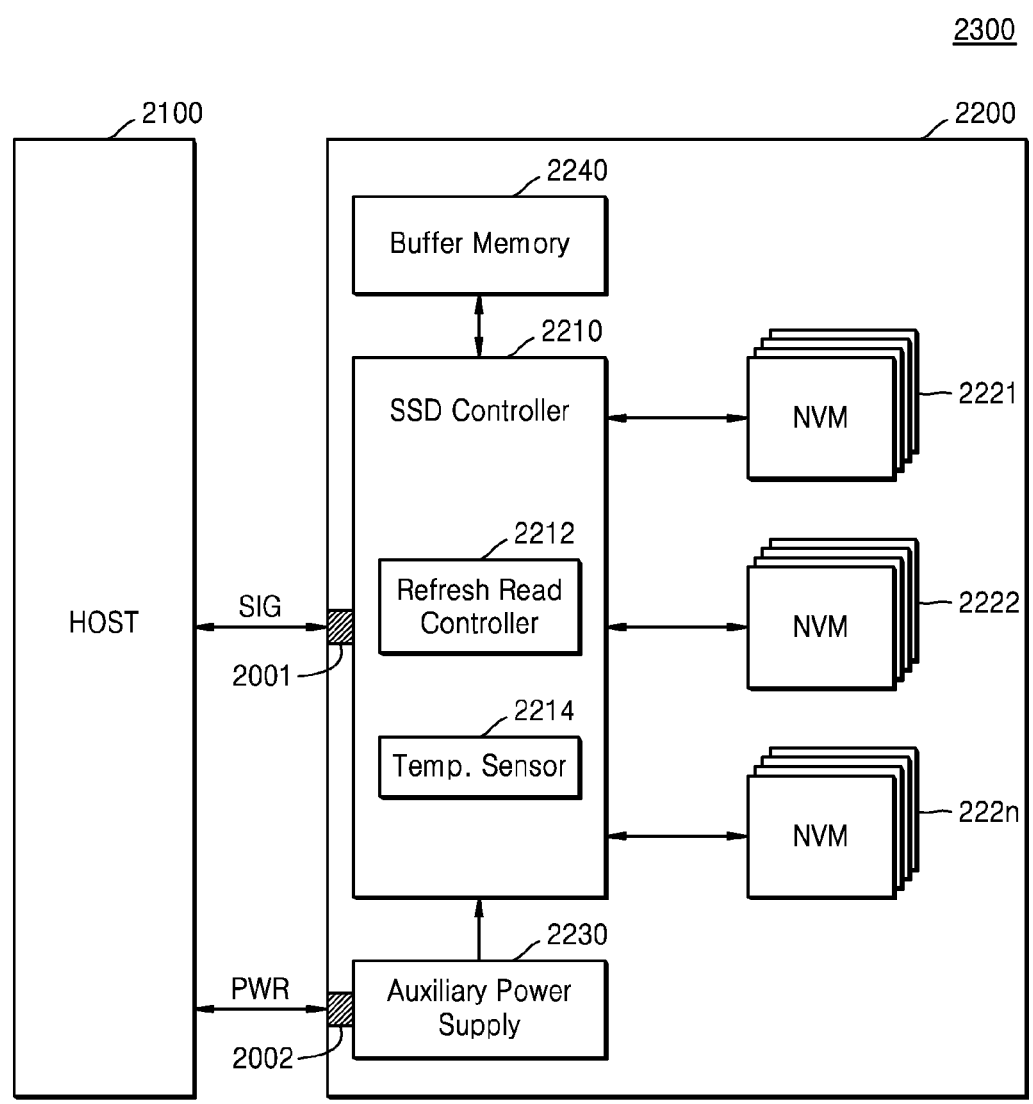
FIG. 23 is a block diagram illustrating an example of a solid state drive (SSD) system to which a memory system that performs a refresh read operation according to embodiments of the disclosure is applied.

FIG. 23 is a block diagram illustrating an example of a solid state drive (SSD) system 2300 to which a memory system that performs a refresh read operation according to embodiments of the disclosure is applied.

Referring to FIG. 23, the SSD system 2300 may include a host 2100 and an SSD 2200. The SSD 2200 may exchange a signal SIG with the host 2100 through a signal connector 2001 and receive power PWR through a power connector 2002. The SSD 2200 may include an SSD controller 2210, a plurality of flash memories 2221 through 222n, an auxiliary power supply 2230, and a buffer memory 2240.

The SSD controller 2210 may control the plurality of flash memories 2221 through 222n in response to the signal SIG received from the host 2100. For example, the SSD controller 2210 and the plurality of flash memories 2221 through 222n may include a memory controller and a non-volatile memory device described with reference to FIGS. 1 through 22.

The SSD controller 2210 may include a refresh read controller 2212 and a temperature sensor 2214 providing temperature information of the SSD 2200. The refresh read controller 2212 may control each of a plurality of memory blocks included in the flash memories 2221 through 222n to perform the refresh read operation including a read operation on one of a plurality of word lines of a corresponding memory block.

The refresh read controller 2212 may control all of the memory blocks included in the flash memories 2221 through 222n to continuously perform the refresh read operation simultaneously according to an intensive refresh read operation. The refresh read controller 2212 may control all of the memory blocks included in the flash memories 2221 through 222n to sequentially perform the refresh read operation during a refresh read interval according to a regular refresh read operation.

The refresh read controller 2212 may vary the refresh read interval of the regular refresh read operation according to the temperature information of the temperature sensor 2214. Alternatively, the refresh read controller 2212 may vary the refresh read interval according to an entire availability amount of all the memory blocks included in the flash memories 2221 through 222n, a valid data amount, a data distribution state, or a wearing level according to programming and delete P/E operations.

The auxiliary power supply 2230 may be connected to the host 2100 through the power connector 2002. The auxiliary power supply 2230 may be charged with the power PWR received from the host 2100. The auxiliary power supply 2230 may provide power of the SSD system 2300 when the host 2100 does not normally supply power. For example, the auxiliary power supply 2230 may be placed inside or outside the SSD 2200. For example, the auxiliary power supply 2230 may be placed in a main board of the SSD system 2300 and may supply auxiliary power to the SSD 2200.

The SSD 2200 may perform the refresh read operation of the flash memories 2221 through 222n by using the power PWR charged in the auxiliary power supply 2230 during sudden power off.

The buffer memory 2240 may operate as a buffer memory of the SSD 2200. For example, the buffer memory 2240 may temporarily store data received from the host 2100 or the flash memories 2221 through 222n or may temporarily store the refresh read controller 2212 implemented as a software layer. For example, the refresh read controller 2212 may be implemented as firmware and stored in some of the flash memories 2221 through 222n.

Figure 24:
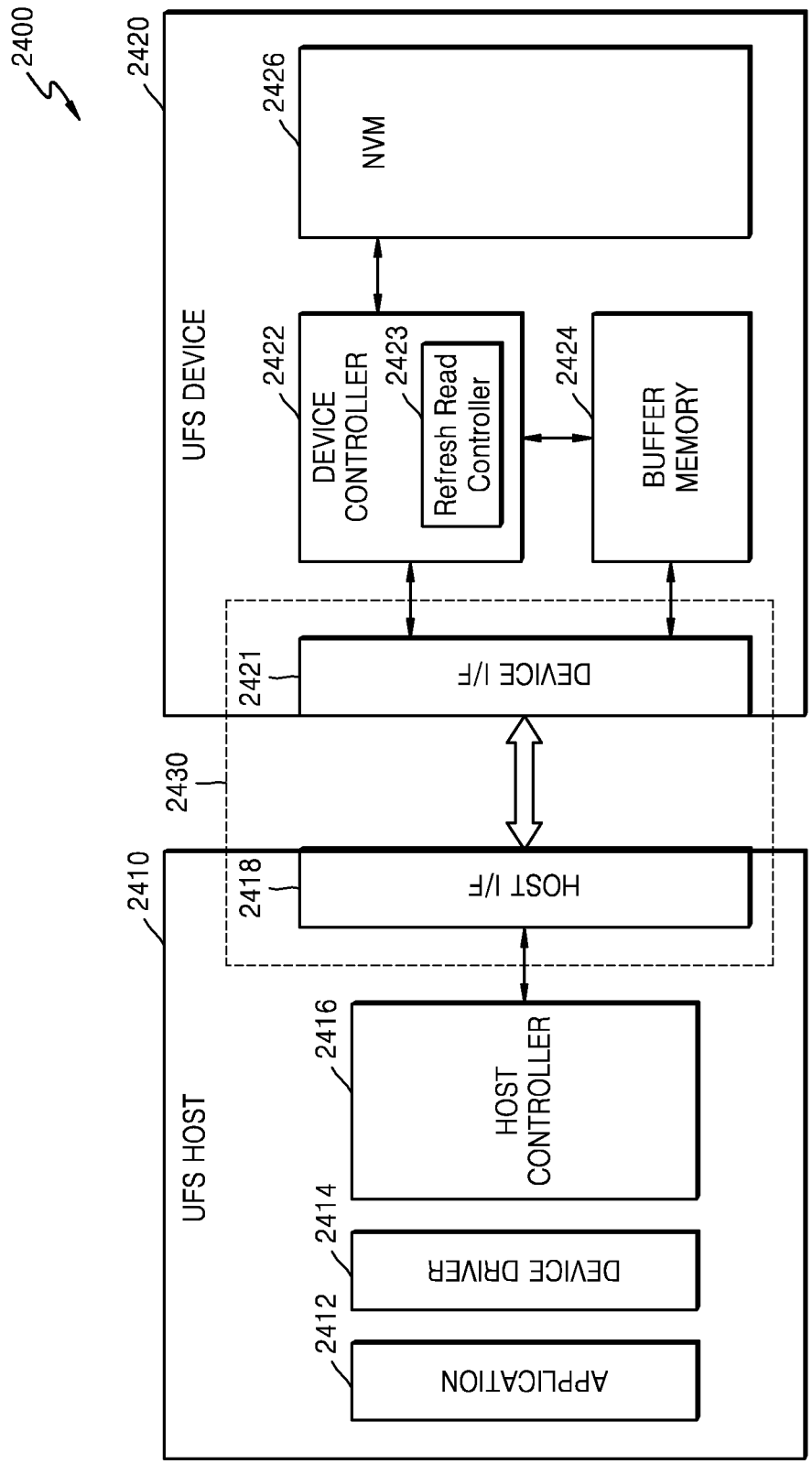
FIG. 24 is a block diagram illustrating an example of a universal flash storage (UFS) system to which a memory system that performs a refresh read operation according to embodiments of the disclosure is applied.

FIG. 24 is a block diagram illustrating an example of a universal flash storage (UFS) system 2400 to which a memory system that performs a refresh read operation according to embodiments of the disclosure is applied.

Referring to FIG. 24, the UFS system 2400 may include a UFS host 2410 and a UFS device 2420. The UFS host 2410 and the UFS device 2420 may be connected through a UFS interface 2430. The UFS system 2400 may be based on a flash memory which is a non-volatile memory device and may be mainly used in a mobile device such as a smart phone.

The UFS host 2410 may include an application 2412, a device driver 2414, a host controller 2416, and a host interface 2418. The application 2412 may be various application programs executed in the UFS host 2410. The device driver 2414 may be used to drive peripheral devices connected to and used in the UFS host 2410 and may drive the UFS device 2420. The application 2412 and the device driver 2414 may be implemented through software, firmware, etc.

The host controller 2416 may generate a protocol or a command to be provided to the UFS device 2420 according to requests of the application 2412 and the device driver 2414, and provide the generated command to the UFS device 2420 through the host interface 2418. The host controller 2416 may provide a write command and data to the UFS device 2420 through the host interface 2418 when receiving a write request from the device driver 2414, provide a read command to the UFS device 2420 through the host interface 2418 when receiving a read request therefrom, and receive data from the UFS device 2420.

The UFS device 2420 may be connected to the UFS host 2410 through the device interface 2421. The host interface 2418 and the device interface 2421 may be connected through a data line for transmitting and receiving data or through a power line for providing power.

The UFS device 2420 may include a device controller 2422, a buffer memory 2424, and a non-volatile memory device 2426. The device controller 2422 may control overall operation of the non-volatile memory device 2426 such as a write operation, a read operation, an erase operation, etc. The device controller 2422 may exchange data with the buffer memory 2424 or the non-volatile memory device 2426 through an address and a data bus. The device controller 2422 may include a CPU, a device direct memory access (DMA), a flash DMA, a command manager, a buffer manager, a flash translation layer (FTL), a flash manager, etc.

The UFS device 2420 may provide a command received from the UFS host 2410 to the device DMA and the command manager through the device interface 2421. The command manager may assign the buffer memory 2424 so as to receive data through the buffer manager and send a response signal to the UFS host 2410 when a data transmission preparation is completed.

The UFS host 2410 may transmit the data to the UFS device 2420 in response to the response signal. The UFS device 2420 may store the transmitted data in the buffer memory 2424 through the device DMA and the buffer manager. The data stored in the buffer memory 2424 may be provided to the flash manager through the flash DMA. The flash manager may store the data at a selected address of the non-volatile memory device 2426 with reference to address mapping information of the FTL.

The UFS device 2420 may send the response signal to the UFS host 2410 and notify the UFS host 2410 of a command completion through the device interface 2421 when the data transfer required for the command of the UFS host 2410 and the program are completed. The UFS host 2410 may notify the device driver 2414 and the application 2412 of whether or not receiving of the response signal of the command is completed, and end the corresponding command.

The device controller 2422 and the non-volatile memory device 2426 included in the UFS system 2400 may include a memory controller and the non-volatile memory device described with reference to FIGS. 1 through 22. The device controller 2422 may include a refresh read controller 2423. The refresh read controller 2423 may control each of a plurality of memory blocks included in the non-volatile memory device 2426 to perform a refresh read operation including a read operation on one of a plurality of word lines of the corresponding memory block.

The refresh read controller 2423 may control all of the memory blocks included in the non-volatile memory device 2426 to continuously perform the refresh read operation simultaneously according to an intensive refresh read operation. The refresh read controller 2212 may control all of the memory blocks included in the non-volatile memory device 2426 to sequentially perform the refresh read operation during a refresh read interval according to a regular refresh read operation.

Figure 25:
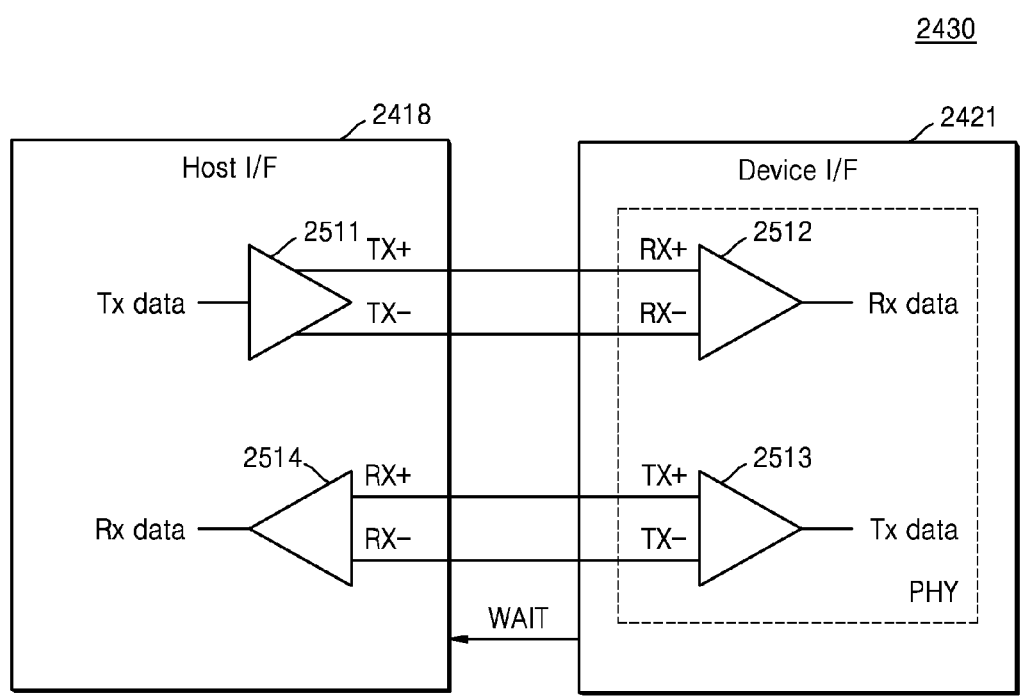
FIG. 25 is a diagram for describing a UFS interface of FIG. 24.

FIG. 25 is a diagram for describing the UFS interface 2430 of FIG. 24.

Referring to FIG. 25, the UFS interface 2430 may use a SATA interface. The SATA interface may be largely divided into a physical layer, a link layer, and a transport layer.

The link layer and the transport layer may convert information data for transmitting data into packet data and transfer the packet data to the physical layer. The link layer and the transport layer may extract the information data from a signal transferred from the physical layer and transfer the extracted information data to an application layer that is an upper layer. The physical layer may convert the packet data transferred from the link layer into an electrical signal and transmit the electrical signal to the outside at high speed. The physical layer may transfer a signal received from the outside to the link layer. To this end, the physical layer may be configured as analog circuits, and the link layer and the transport layer may be configured as digital circuits.

The physical layer of the SATA interface, i.e., an analog circuit, may be identified as an analog front end. The analog front end of the SATA interface may be configured as physical blocks for converting an analog signal into a digital signal or the digital signal into the analog signal.

In FIG. 25, a host SATA interface 2418 may include a transmitter 2511 and a receiver 2514, and a UFS device SATA interface 2421 may include a receiver 2512 and a transmitter 2513. The transmitters 2511 and 2513 and the receivers 2512 and 2514 may correspond to physical layers of the SATA interface. The transmitter 2511 of the host SATA interface 2418 may be connected to the receiver 2512 of the UFS device SATA interface 2421. The transmitter 2513 of the UFS device SATA interface 2421 may be connected to the receiver 2514 of the host SATA interface 2418. The host SATA interface 2418 and the UFS device SATA interface 2421 may be connected to each other by a SATA cable configured as two pairs of unidirectional data lines for transmitting a differential signal Tx+ and Tx− or Rx+ and Rx−.

Figure 26:
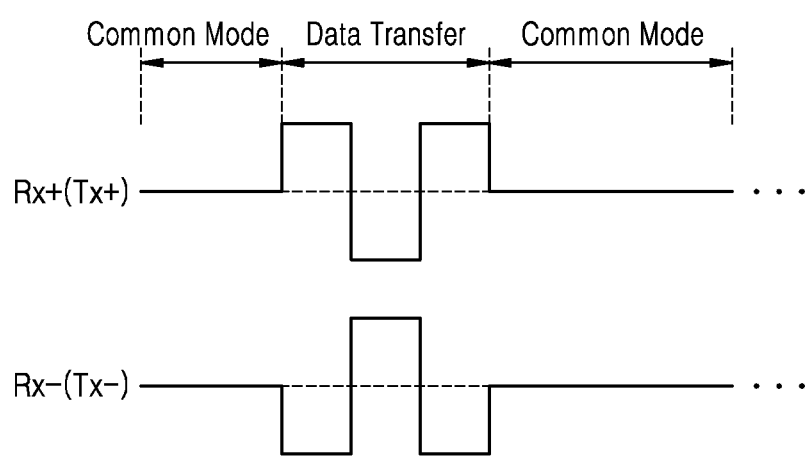
FIG. 26 is a diagram for describing a differential signal transmission method performed by a SATA interface.

FIG. 26 is a diagram for describing a differential signal transmission method performed by a SATA interface.

Referring to FIG. 26, in the SATA interface, a data transmission may be expressed as a data value equal to a difference between two signals Tx+ and Tx− or Rx+ and Rx− transmitted through data lines. Both signals may remain in a middle logic state or a floating state in a section in which no data is transmitted. For example, both signals may have a common mode voltage level in the section in which no data is transmitted.

Figure 27:
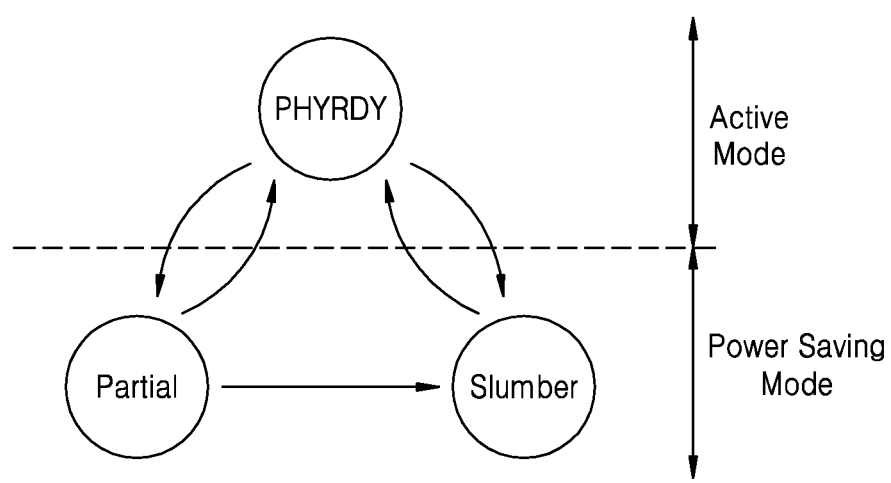
FIG. 27 is a diagram for describing a power management method performed by a SATA interface.

FIG. 27 is a diagram for describing a power management method performed by a SATA interface.

Referring to FIGS. 24 and 27, a protocol of the SATA interface may define a physical layer ready state (hereinafter referred to as a 'PHYRDY state'). The protocol of the SATA interface may define a partial state and a slumber state of the SATA interface for operating in a power saving mode. The PHYRDY state, the partial state, the slumber state may be powered states defined in the SATA specification.

The PHYRDY state may mean a state in which all physical blocks of a physical layer are activated. The partial state and the slumber state may mean a power saving mode in which the SATA interface does not substantially operate. That is, the partial state and the slumber state may mean a state in which power is not supplied to some of physical blocks of the physical layer.

The partial state and the slumber state may be distinguished from each other by a difference in a wake-up time taken for the SATA interface to be restored to the PHYRDY state from a corresponding mode and power consumption. In the partial state, no power may be supplied to a physical block relating to data transmission and reception. In the slumber state, no power may be supplied to all physical blocks except for a squelch circuit. Accordingly, the partial state may be restored faster than the slumber state in view of the wake-up time from the PHYRDY state. The power consumption of the SATA interface in the slumber state may be less than that of the SATA interface in the partial state.

The SATA interface 2430 may be a power management method and may support an initiate power management (IPM) function. IPM may be divided into host IPM (HIPM) and device IPM (DIPM). HIPM changes power states of the host SATA interface 2418 and the UFS device SATA interface 2421 according to a request of the host SATA interface 2418. DIPM changes the power states of the host SATA interface 2418 and the UFS device SATA interface 2421 according to a request of the UFS device SATA interface 2421.

The host SATA interface 2418 that wants to operate in a power saving mode may transmit a power saving mode request signal to the UFS device SATA interface 2421 by using HIPM. The UFS device SATA interface 2421 that receives the power saving mode request signal may transmit a response signal to the host SATA interface 2418 when it is possible to enter the power saving mode. Through this process, the host SATA interface 2418 and the UFS device SATA interface 2421 may operate in the power saving mode. That is, the host SATA interface 2418 and the UFS device SATA interface 2421 may maintain one of the partial state and the slumber state.

During the power saving mode, the host SATA interface 2418 that wants to operate in an active mode may transmit a request signal for escaping from the power saving mode and may perform out of band (OOB) signaling for forming a communication link with the SATA interface 2430. OOB signaling may also be performed during a power on sequence operation. Through this process, the host SATA interface 2418 and the UFS device SATA interface 2421 may operate in the active mode.

Figure 28:
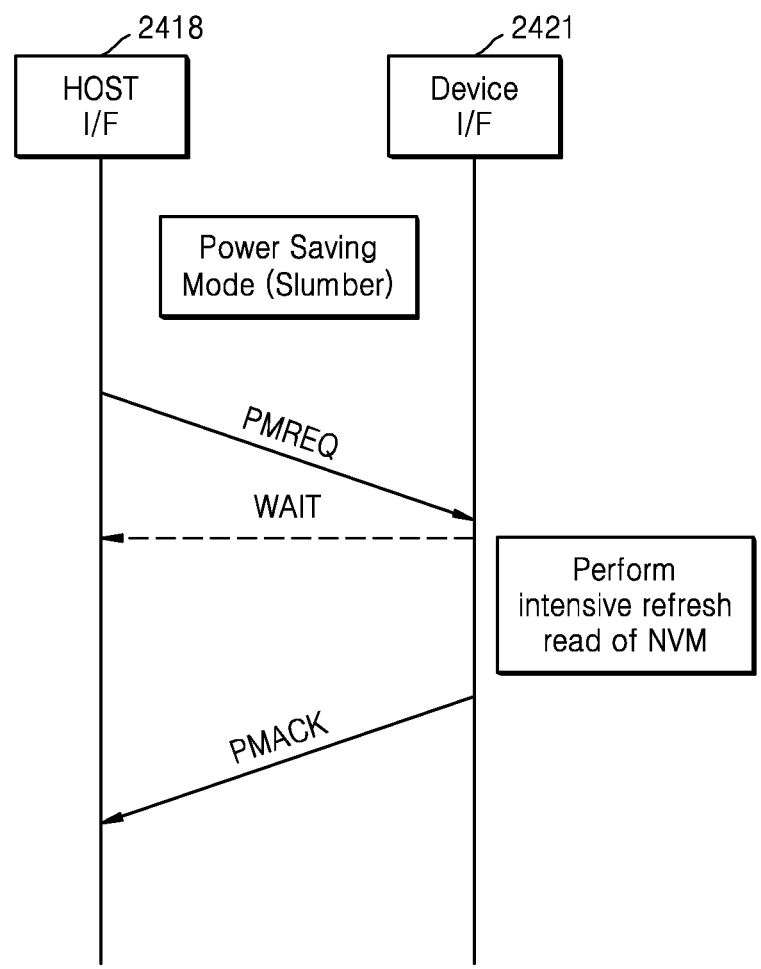
FIG. 28 is a diagram for describing an intensive refresh read operation performed by a UFS device of FIG. 24 in a power saving mode.

FIG. 28 is a diagram for describing an intensive refresh read operation performed by the UFS device 240 of FIG. 24 in a power saving mode.

Referring to FIGS. 24, 27, and 28, the host SATA interface 2418 and the UFS device SATA interface 2421 may detect an idle section in which no command is transmitted. If a command idle section is more than a preset time, for example, 60 ms, the host SATA interface 2418 may transmit a signal PMREQ requesting the UFS device SATA interface 2421 to operate in a power saving mode, for example, a slumber state, to the UFS device SATA interface 2421.

If the host SATA interface 2418 transmits the power saving mode request signal PMREQ to the UFS device SATA interface 2421, the UFS device SATA interface 2421 that receives the power saving mode request signal PMREQ may transmit a response signal PMACK to the host SATA interface 2418 when it is possible to enter the power saving mode. The UFS device 240 may perform an intensive refresh read operation of the non-volatile memory device 2426 in response to the power saving mode request signal PMREQ of the slumber state. If the intensive refresh read operation of the non-volatile memory device 2426 is completed, the UFS device SATA interface 2421 may transmit the response signal PMACK indicating that it is possible to enter the power saving mode to the host SATA interface 2418.

For example, the UFS device SATA interface 2421 may transmit a wait signal WAIT to the SATA interface 2418 when the intensive refresh read operation of the non-volatile memory device 2426 begins. The wait signal WAIT may notify the host SATA interface 2418 that an intensive refresh read operation of the UFS device 2420 will be firstly performed.

Figure 29:
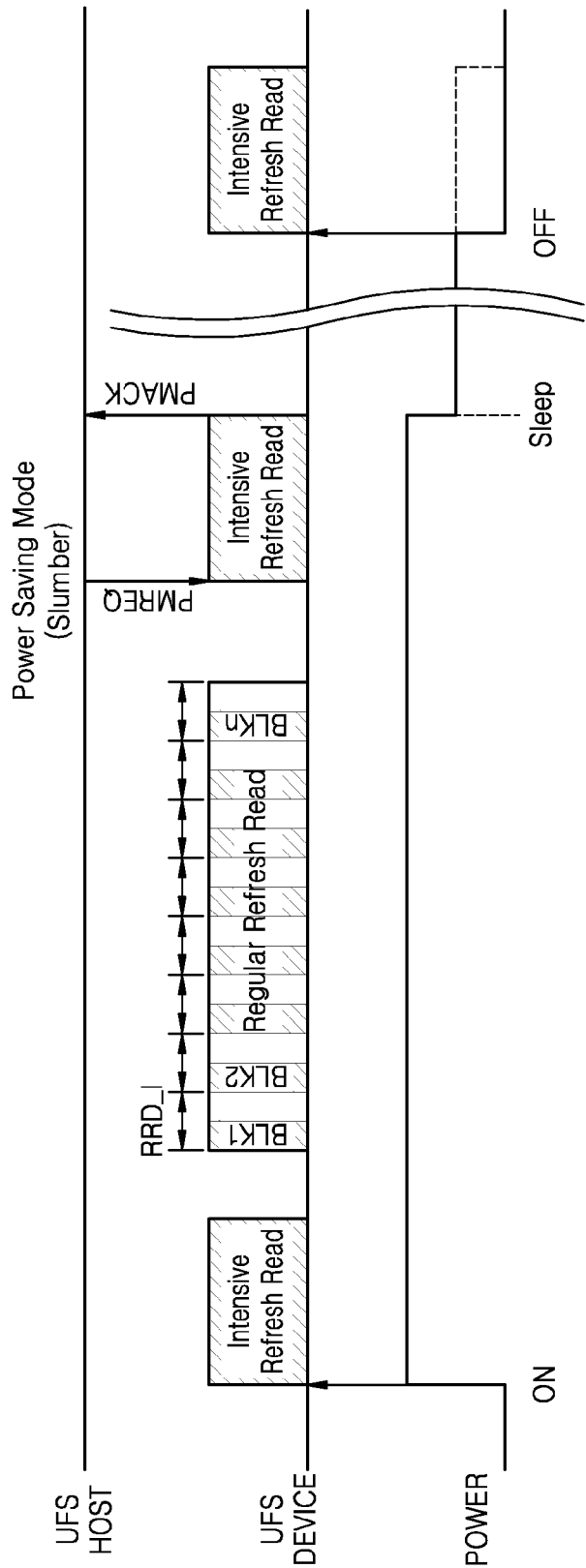
FIG. 29 is a diagram for describing a refresh read operation performed by the UFS system of FIG. 24.

FIG. 29 is a diagram for describing a refresh read operation performed by the UFS system 2400 of FIG. 24.

Referring to FIGS. 24 and 29, when the UFS system 2400 is powered on, the UFS device 2420 may perform an intensive refresh read operation of continuously refresh reading all memory blocks of the non-volatile memory device 2426 at one time.

After the UFS system 2400 is powered on, the UFS device 2420 may perform a regular refresh read operation of sequentially refresh reading memory blocks of the non-volatile memory device 2426 at the refresh read interval RDD_I.

The UFS device 2420 may perform the intensive refresh read operation of continuously refresh reading all memory blocks of the non-volatile memory device 2426 at one time in response to the power saving mode request signal PMREQ of a slumber state according to a power saving mode request of the host 2410. If the intensive refresh read operation of the non-volatile memory device 2426 is completed, the UFS device 2420 may transmit the response signal PMACK indicating that it is possible to enter a power saving mode to the host 2410. Thereafter, the UFS device 2420 may be changed to a sleep state in which no power is supplied to blocks, and thus power consumption may be reduced.

When the UFS system 2400 is powered off, the UFS device 2420 may perform the intensive refresh read operation of continuously refresh reading all memory blocks of the non-volatile memory device 2426 at one time. For example, during sudden power off, the UFS device 2420 may perform the intensive refresh read operation by using auxiliary power charged in an auxiliary power supply of the UFS device 2420.

The above-described embodiments of the disclosure may be implemented not only as a device and method but also as a program which realizes functions corresponding to components of the embodiments of the disclosure or through a recording medium on which a program is recorded. This implementation may be easily made by one of ordinary skill in the art from the above-described descriptions.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been particularly shown and described with reference to embodiments thereof, it will be understood that various changes in form and details may be made therein without departing from the spirit and scope of the following claims.

What is claimed is:

1. An operating method executed by a memory controller configured to control a non-volatile memory (NVM) device comprising a plurality of memory blocks, each memory block comprising a plurality of memory cells connected to a plurality of word lines, the operating method comprising:
   detecting a powering-on of the NVM device; and
   controlling, in response to detecting the powering-on of the NVM device, the NVM device to execute a read refresh operation on no more than one of the word lines of each of the plurality of memory blocks of the NVM device, the refresh read operation comprising a read operation.

2. The operating method of claim 1, wherein the refresh read operation is applied to each of the memory blocks sequentially in response to detecting the powering-on.

3. The operating method of claim 1, wherein:
   the controlling comprises providing an address signal to the NVM device, and
   during the refresh read operation, the one of the plurality of word lines on which the read operation is performed is the same in each of the plurality of memory blocks according to the address signal.

4. The method of claim 1, wherein:
the controlling comprises providing an address signal to the NVM device, and
during the refresh read operation, the one of the plurality of word lines on which the read operation is performed is different in each of the plurality of memory blocks according to the address signal.

5. The method of claim 1, wherein:
the controlling comprises providing an address signal to the NVM memory device, and
during the refresh read operation, the plurality of memory blocks is divided into predetermined groups and the one of the plurality of word lines on which the read operation is performed is different in each of the predetermined groups according to the address signal.

6. The method of claim 1, further comprising disregarding during the refresh read operation: (1) an operation of providing data transferred to bit lines, of each of the plurality of memory blocks, to a page buffer according to the read operation of each of the plurality of memory blocks and (2) an operation of determining, with the page buffer, a voltage level of the data transferred to the bit lines.

7. The method of claim 1, wherein in the controlling during the refresh read operation, data transferred to bit lines of each of the plurality of memory blocks is not provided to a page buffer according to the read operation of each of the plurality of memory blocks.

8. The method of claim 1, wherein in the controlling during the refresh read operation, a selection read voltage, from among a plurality of selection read voltages used to determine data of the plurality of memory cells, is selectively applied to one of the plurality of word lines.

9. The method of claim 8, wherein in the controlling during the refresh read operation, the selection read voltage applied to one of the plurality of word lines is the same in all of the plurality of memory blocks.

10. The method of claim 8, wherein in the controlling during the refresh read operation, the selection read voltage applied to one of the plurality of word lines is different in each of the plurality of memory blocks.

11. An operating method executed by a memory controller configured to control a non-volatile memory (NVM) device comprising a plurality of memory blocks comprising a plurality of memory cells, wherein each of the plurality of memory blocks is connected to a plurality of word lines, the operating method comprising:
detecting a powering-off of the NVM device; and
controlling, in response to detecting the powering-off of the NVM device, the NVM device to execute a read refresh operation on no more than one of the word lines of each of the plurality of memory blocks of the NVM device, the refresh read operation comprising a read operation.

12. The operating method of claim 11, wherein refresh read operation is applied to each of the memory blocks sequentially in response to detecting the powering-off.

13. The operating method of claim 11, wherein the controlling comprises when the NVM device is powered off according to a sudden power off, continuously performing the refresh read operation on all of the plurality of memory blocks simultaneously.

14. The operating method of claim 13, wherein the controlling comprises performing the refresh read operation on all of the plurality of memory blocks beginning with a memory block that operated right before the sudden power off.

15. The operating method of claim 13, wherein the controlling comprises performing the refresh read operation using an auxiliary power supply connected to the NVM device.

16. An operating method executed by a memory controller configured to control a non-volatile memory (NVM) device comprising a plurality of memory blocks comprising a plurality of memory cells, wherein each of the plurality of memory blocks is connected to a plurality of word lines, the operating method comprising:
issuing a refresh read command at a refresh read interval after the NVM device is powered on; and
controlling, in response to issuing the refresh read command, the NVM device to execute a read refresh operation on no more than one of the word lines of each of the plurality of memory blocks of the NVM device, the refresh read operation comprising a read operation that is executed during the refresh read interval.

17. The operating method of claim 16, wherein the controlling comprises varying the refresh read interval according to a temperature of the NVM device.

18. The operating method of claim 16, wherein the controlling comprises varying the refresh read interval according to an amount of the plurality of memory blocks that is available, a valid data amount, a data distribution state, or a wearing level according to programming and delete operations.

19. The method of claim 16, wherein:
the controlling comprises providing an address signal to the NVM device, and
the plurality of memory blocks is divided into predetermined groups and each of the predetermined groups performs the refresh read operation according to the address signal during the refresh read interval.

20. The operating method of claim 19, wherein:
the controlling comprises providing an address signal to the NVM device, and
the refresh read operation is continuously performed, according to the address signal, with respect to a first half of the plurality of memory blocks and, after the refresh read interval, the refresh read operation is continuously performed, according to the address signal, with respect to a second half of the plurality of memory blocks.

\* \* \* \* \*